United States Patent
Kohara

(10) Patent No.: US 10,916,299 B2
(45) Date of Patent: Feb. 9, 2021

(54) SEMICONDUCTOR STORAGE DEVICE AND OPERATION METHOD THEREOF

(71) Applicant: Toshiba Memory Corporation, Tokyo (JP)

(72) Inventor: Koji Kohara, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/558,430

(22) Filed: Sep. 3, 2019

(65) Prior Publication Data

US 2020/0243131 A1    Jul. 30, 2020

(30) Foreign Application Priority Data

Jan. 30, 2019    (JP) .................................. 2019-013919

(51) Int. Cl.
 *G11C 11/00*    (2006.01)
 *G11C 11/419*    (2006.01)
 *G11C 11/412*    (2006.01)

(52) U.S. Cl.
 CPC .......... *G11C 11/419* (2013.01); *G11C 11/412* (2013.01)

(58) Field of Classification Search
 CPC .............................. G11C 11/419; G11C 11/412
 USPC ......................................................... 365/154
 See application file for complete search history.

(56) References Cited

U.S. PATENT DOCUMENTS

| 8,605,526 B2 | 12/2013 | Huber et al. |
| 8,824,196 B2 | 9/2014 | Behrends et al. |
| 2006/0209606 A1* | 9/2006 | Rajwani ................. G11C 7/062 365/205 |
| 2015/0310909 A1* | 10/2015 | Chu ........................ G11C 8/16 365/154 |
| 2017/0263333 A1 | 9/2017 | Sano et al. |

FOREIGN PATENT DOCUMENTS

JP    2013-214343 A    10/2013

* cited by examiner

*Primary Examiner* — Huan Hoang
(74) *Attorney, Agent, or Firm* — Kim & Stewart LLP

(57) ABSTRACT

A semiconductor storage device comprises a memory cell, a write word line and a read word line connected to the memory cell, first and second write bit lines connected to the memory cell, first and second read bit lines connected to the memory cell, a precharge circuit, and a sense amplifier circuit. The precharge circuit is configured to charge, before reading from the memory cell, the first read bit line to a first potential and the second read bit line to a second potential lower than the first potential. The sense amplifier circuit is configured to amplify a difference in potential between the first read bit line and the second read bit line during the reading from the memory cell and output a signal corresponding to the difference in potential as a read value.

19 Claims, 20 Drawing Sheets

FIG. 8A

| PREn | RBLt | RBLb |
|------|------|------|
| L    | H    | H    |

FIG. 8B

| TPRE0n | TPRE0p | RBLt | RBLb |
|--------|--------|------|------|
| L      | H      | H    | H-Vt |

FIG. 8C

| TPRE1p | TPRE1n | RBLt | RBLb |
|--------|--------|------|------|
| H      | L      | H-Vt | H    |

FIG. 13A

| PREn | RBLt | RBLb |
|------|------|------|
| L    | H    | H    |

FIG. 13B

| TPRE0n | TPRE0p | RBLt | RBLb |
|--------|--------|------|------|
| L      | H      | H    | aH   |

FIG. 13C

| TPRE1p | TPREL1n | RBLt | RBLb |
|--------|---------|------|------|
| H      | L       | aH   | H    |

FIG. 15A

| PREn | RBLt | RBLb |
|------|------|------|
| L | H | H |

FIG. 15B

| TPRE0n | TPRE0p | RBLt | RBLb |
|--------|--------|------|------|
| L | H | H | H-Vt |

FIG. 15C

| TPRE1p | TPRE1n | RBLt | RBLb |
|--------|--------|------|------|
| H | L | H-Vt | H | ered herein by reference.

SEMICONDUCTOR STORAGE DEVICE AND OPERATION METHOD THEREOF

CROSS-REFERENCE TO RELATED APPLICATION

This application is based upon and claims the benefit of priority from Japanese Patent Application No. 2019-013919, filed Jan. 30, 2019, the entire contents of which are incorporated herein by reference.

FIELD

Embodiments described herein relate generally to a semiconductor storage device and a method for operating the same.

BACKGROUND

As one of the fields of large scale integrations (LSI) static random access memories (SRAMs) have led to miniaturization of electronics and semiconductor devices along with dynamic random access memories (DRAMs). Since SRAM can be relatively easily used and can be manufactured through a standard CMOS process, SRAM has widely been used as a built-in memory of microprocessor (MPU) and system-on-chip (SoC) devices. A multi-port SRAM provided with two or more reading dedicated ports and writing dedicated ports has also been used.

It may be difficult to detect bit line states of a memory cell and an opening failure in a two-port SRAM. For example, in a case in which an opening failure occurs in a reading dedicated port of the two-port SRAM and a complementary bit line pair has both bit lines at a high level H, it may be difficult to detect an opening failure due to a bias of a sense amplifier.

DESCRIPTION OF THE DRAWINGS

FIG. 8A illustrates an operation example in which a precharge enable signal PREn is set in a low level L and both bit lines RBLt and RBLb are precharged in a high level H.

FIG. 8B illustrates a test operation example of data "0" in which a precharge gate signal TPRE0$n$ is set in the low level L, a precharge gate signal TPRE0$p$ is set in the high level H, the bit line RBLt is precharged in the high level H, and the bit line RBLb is precharged in the high level H-Vt.

FIG. 8C illustrates a test operation example of data "1" in which a precharge gate signal TPRE1$p$ is set in the high level H, a precharge gate signal TPRE1$n$ is set in the low level L, the bit line RBLt is precharged in a high level H-Vt, and the bit line RBLb is precharged in the high level H.

FIG. 13A illustrates an operation example in which the precharge enable signal PREn is set in the low level L and both the bit lines RBLt and RBLb are precharged in the high level H.

FIG. 13B illustrates a test operation example of data "0" in which the precharge gate signal TPRE0$n$ is set in the low level L, the precharge gate signal TPRE0$p$ is set in the high level H, the bit line RBLt is precharged in the high level H, and the bit line RBLb is precharged in a high level aH (<H).

FIG. 13C illustrates a test operation example for data "0" in which the precharge gate signal TPRE1$p$ is set in the high level H, the precharge gate signal TPRE1$n$ is set in the low level L, the bit line RBLt is precharged in the high level aH (<H), and the bit line RBLb is precharged in the high level H.

FIG. 15A illustrates an operation example in which the precharge enable signal PREn is set in the low level L and both the bit lines RBLt and RBLb are precharged in the high level H.

FIG. 15B illustrates a test operation example for data "0" in which the precharge gate signal TPRE0$n$ is set in the low level L, the precharge gate signal TPRE0$p$ is set in the high level H, the bit line RBLt is precharged in the high level H, and the bit line RBLb is precharged in the high level H-Vt.

FIG. 15C illustrates a test operation example of data "1" in which the precharge gate signal TPRE1$p$ is set in the high level H, the precharge gate signal TPRE1$n$ is set in the low level L, the bit line RBLt is precharged in the high level H-Vt, and the bit line RBLb is precharged in the high level H.

DETAILED DESCRIPTION

Figure 1:
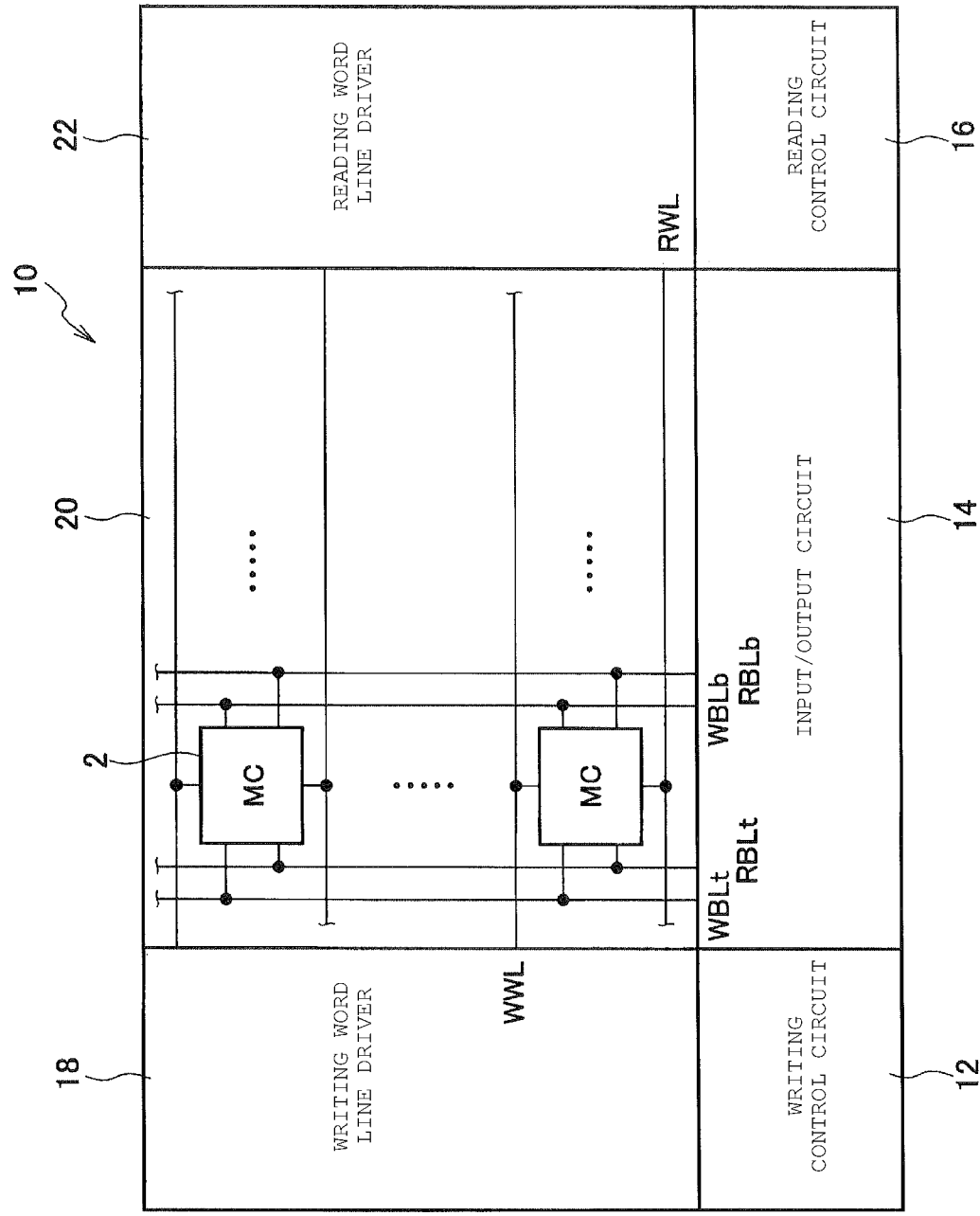
FIG. 1 is a block diagram illustrating a schematic configuration of a semiconductor storage device according to an embodiment

Embodiments provide a semiconductor storage device that more reliably fails in a case in which an opening failure occurs and a method for operating the same.

In general, according to an embodiment, a semiconductor storage device comprises a memory cell, a write word line and a read word line connected to the memory cell, first and second write bit lines connected to the memory cell, first and second read bit lines connected to the memory cell, a precharge circuit, and a sense amplifier circuit. The precharge circuit is configured to charge, before reading from the memory cell, the first read bit line to a first potential and the second read bit line to a second potential lower than the first potential. The sense amplifier circuit is configured to amplify a difference in potential between the first read bit line and the second read bit line during the reading from the memory cell and output a signal corresponding to the difference in potential as a read value.

Next, embodiments will be described with reference to drawings. In the following description of the drawings, the same or similar reference numerals will be given to the same or similar parts. However, the drawings are schematic drawings, and it should be noted that relationships and the like of thicknesses and planar dimensions of the respective components are different from actual relationships. Therefore, specific thicknesses and dimensions should be determined in consideration of the following description. It is a matter of course that some parts have relationships and ratios different among drawings.

The embodiments described below are for exemplifying a device and a method for specifically realizing technical ideas and are not intended to specify materials, shapes, structures, arrangement, and the like of the respective components. Various modifications may be added to the embodiments within the scope of the claims.

In the following description, a writing word line WWL, writing bit lines WBLt and WBLb, a reading word line RWL, and reading bit lines RBLt and RBLb may be described as a word line WWL, bit lines WBLt and WBLb, a word line RWL, and bit lines RBLt and RBLb for simplification.

Embodiments

A schematic overall block configuration of a semiconductor storage device 10 according to an embodiment includes a memory cell array 20, a reading word line RWL and a writing word line WWL, a writing bit line pair WBLt and WBLb, a reading bit line pair RBLt and RBLb, a writing word line driver 18, a reading word line driver 22, an input/output circuit 14, a writing control circuit 12, and a reading control circuit 16 as illustrated in FIG. 1.

The memory cell array 20 includes a plurality of two-port memory cells 2 arranged in a matrix shape.

The reading word line RWL and a writing word line WWL are connected to the two-port memory cells 2 and selects a two-port memory cell 2.

The writing bit line pair WBLt and WBLb are connected to the two-port memory cells 2 and write data in the two-port memory cells 2.

The reading bit line pair RBLt and RBLb are connected to the two-port memory cells 2 and read data in the two-port memory cells 2.

The writing word line driver 18 drives the two-port memory cells 2 for writing via the writing word line WWL.

The reading word line driver 22 drives the two-port memory cells 2 for reading via the reading word line RWL.

First, operations and bias of a typical sense amplifier will be described.

Figure 20:
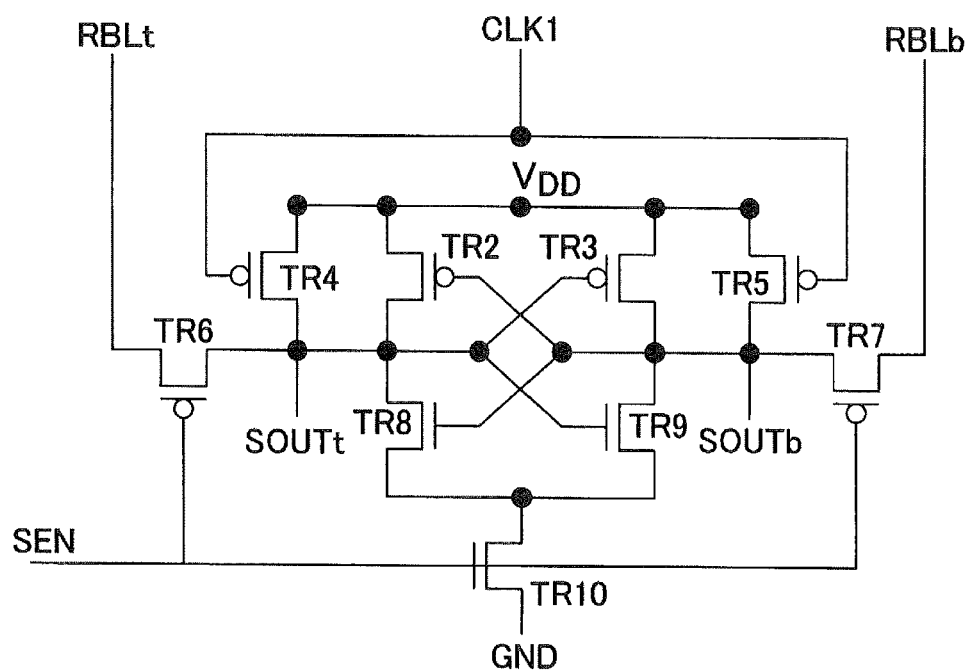
FIG. 20 is a circuit diagram illustrating bias and operations of a sense amplifier.
Figure 21:
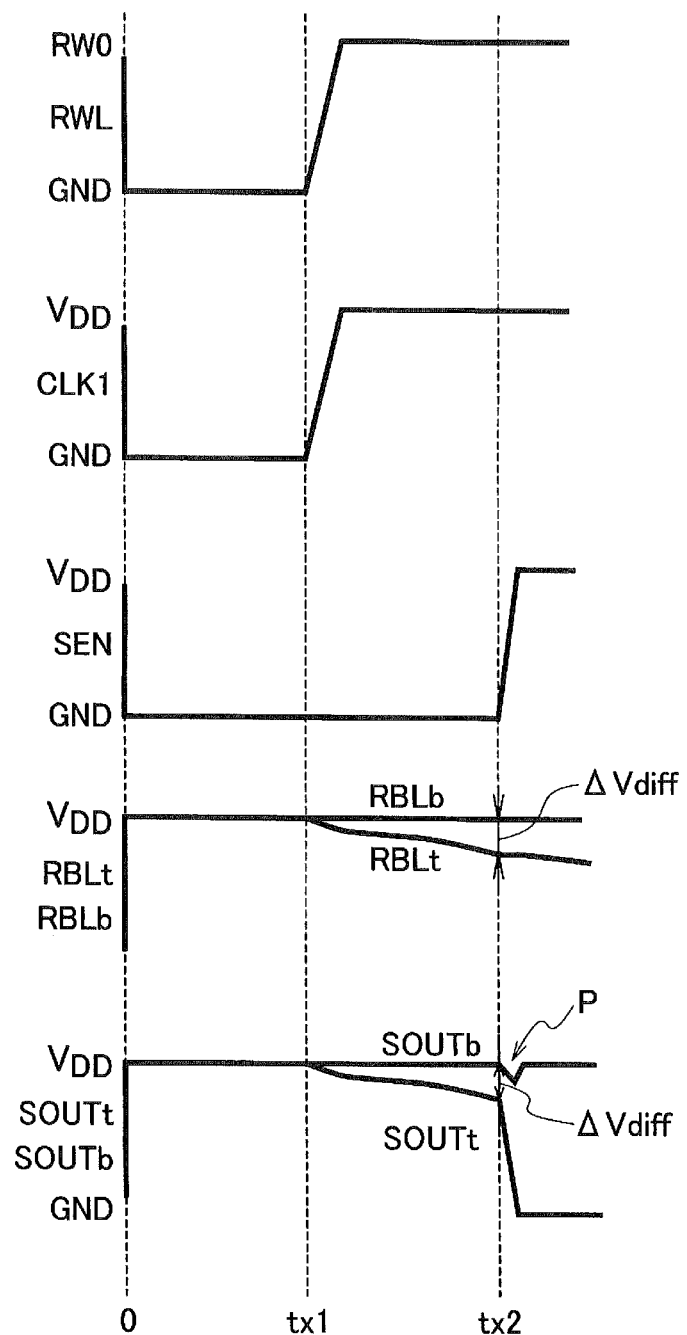
FIG. 21 is a waveform diagram illustrating bias and operations of a sense amplifier.

A circuit configuration of a typical sense amplifier is illustrated in FIG. 20, and an operation waveform is illustrated in FIG. 21. FIG. 20 illustrates an example of a latch-type sense amplifier. In the circuit example of FIG. 20, all transistors TR2, TR3, TR4, TR5, TR6, and TR7 are configured using pMOSFETs, and all transistors TR8, TR9, and TR10 are configured using nMOSFETs.

As illustrated in FIG. 20, the sense amplifier circuit configures a flip-flop with mutual outputs of two inverters respectively configured using two MOSFETs (TR2 and TR8, and TR3 and TR9) are connected to inputs of the counterparts between a power source voltage $V_{DD}$ and a ground potential GND.

As illustrated in FIG. 20, the sense amplifier circuit includes transfer transistors TR6 and TR7, each of which has one main terminal connected to each of the reading bit line pair RBLt and RBLb and the other main terminal connected to an output node of the flip-flop. Sense amplifier outputs SOUTt and SOUTb are output from the output node of the flip-flop.

As illustrated in FIG. 20, the sense amplifier circuit includes transistors TR4 and TR5 that are connected between the power source voltage $V_{DD}$ and the output node of the flip-flop.

Further, a drain of the transistor TR10 is connected to a common source of the transistors TR8 and TR9 while a source of the transistor TR10 is connected to GND.

A clock signal CLK1 is input to gates of the transistors TR4 and TR5, and the sense amplifier outputs SOUTt and SOUTb are clamped to a value of the power source voltage $V_{DD}$ at a timing at which the clock signal CLK1 is in a low level.

A sense amplifier enable signal SEN is input to gates of the transfer transistors TR6 and TR9 and the transistor TR10.

—Operations and Bias of Sense Amplifier—

(a) First, it is assumed that the reading bit line pair RBLt and RBLb have already been precharged at the power source voltage $V_{DD}$, for example.

(b) Since the clock signal CLK1 is in a low level and the sense amplifier enable signal SEN is also in a low level during a period from a time 0 to a time tx1, the transistors TR4, TR5, TR6, and TR7 are in an ON state, and the transistor TR10 is in an OFF state. Therefore, the sense amplifier outputs SOUTt and SOUTb reach the level of the power source voltage $V_{DD}$ that is the same as that of the reading bit line pair RBLt and RBLb.

(c) Next, at the time tx1, the potential level of the reading word line RWL becomes a high level, and a reading operation of a memory cell, which is not illustrated in the drawing, is started. Therefore, the potential of either the reading bit line RBLt or RBLb starts to drop. Here, it is assumed that the reading bit line RBLt is discharged, and the potential thereof drops.

At the time tx1, the clock signal CLK1 is also turned into a high level, the transistors TR4 and TR5 are brought into the OFF state, and the sense amplifier outputs SOUTt and SOUTb follow the potential level of the reading bit line pair RBLt and RBLb.

(d) Next, at a time tx2, a potential difference ΔVdiff between the sense amplifier outputs SOUTt and SOUTb becomes sufficiently large, the sense amplifier enable signal SEN is brought into an enable state (high level), and the transistor TR 10 is brought into the ON state. Thus, the transistors TR8 and TR9 respectively start turning-on. However, since the potential of the sense amplifier output SOUTb is higher than the sense amplifier output SOUTt by ΔVdiff, the transistor TR 8 is turned on earlier corresponding to the difference. In this manner, the potential of the sense amplifier output SOUTt quickly drops by being drawn by GND.

The transistor TR9 on the side of the sense amplifier output SOUTb is also turned on although it is later than the transistor TR8. Therefore, the potential drops for a moment as represented by the arrow P. However, since the sense amplifier output SOUTt quickly approaches GND, the transistor TR9 is immediately turned off, and the potential does not further drop.

The transistor TR3 is turned on by the potential of the sense amplifier output SOUTt dropping. In this manner, the sense amplifier output SOUTb is charged to the power source voltage $V_{DD}$, and the potential is thus immediately recovered to the power source voltage $V_{DD}$.

(e) In this manner, the initial potential difference ΔVdiff is amplified, the sense amplifier output SOUTb becomes a high-level H output, and the sense amplifier output SOUTt becomes a low-level L output.

If there is no initial potential difference between the sense amplifier output SOUTt and the sense amplifier output SOUTb there will be no amplification through the aforementioned operation. An opening failure can be detected.

However, threshold voltages of the transistors TR8 and TR9 are not precisely uniform, and in a case in which the transistor TR8 is turned on earlier than the transistor TR9, an operation that is similar to that in a case in which there is an initial potential difference may be performed. Since the transistor TR8 is turned on first, an amplification operation occurs. Therefore, a result that is the same as a result obtained in a normal operation, that is, the sense amplifier output SOUTt in the low level L and the sense amplifier output SOUTb in the high level H is obtained as an output of the sense amplifier due to an opening failure even though there is no potential difference, and, as such, it is difficult to detect an opening failure.

There is also a case in which the sense amplifier performs amplification, even though an amplification operation should be performed, when there are differences in wiring resistances, capacitance differences of the bit lines, or the like. Variations in operations of the sense amplifier that lead to such unintended amplifications will be collectively referred to in this context as "bias" of the sense amplifier. Although the example of the latch-type sense amplifier has been particularly described here, such variations are also present in sense amplifiers based on other operation schemes.

The input/output circuit 14 is connected to the writing bit line pair WBLt and WBLb and the reading bit line pair RBLt and RBLb and writes and reads data in the two-port memory cells 2.

The writing control circuit 12 is connected to the writing word line driver 18 and the input/output circuit 14 and controls writing of data in the two-port memory cells 2.

The reading control circuit 16 is connected to the reading word line driver 22 and the input/output circuit 14 and controls reading of data from the two-port memory cells 2.

Configuration of Two-Port Memory Cells

Figure 2A:
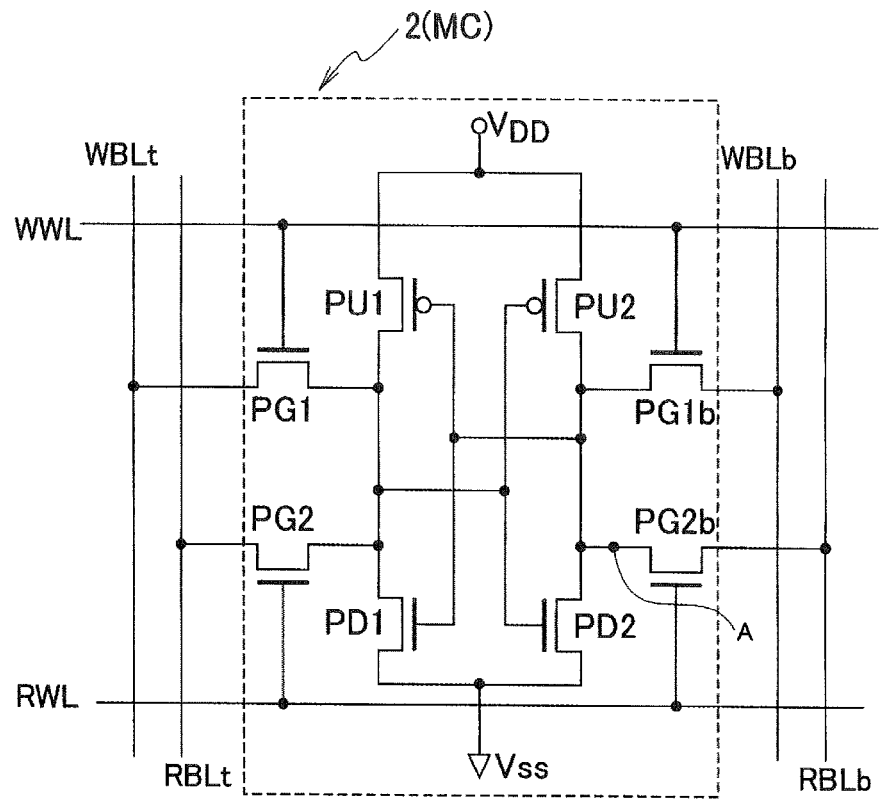
FIG. 2A is a circuit diagram of a two-port memory cell applicable to the semiconductor storage device according to the embodiment.

A circuit configuration of a two-port memory cell (MC) 2 applicable to the semiconductor storage device 10 according to the embodiment is illustrated in FIG. 2A. Also, a circuit configuration of the two-port memory cell 2 and a typical precharge circuit 24A thereof is illustrated in FIG. 2B.

Two inverters, each of which includes two MOSFETs (PU1 and PD1, and PU2 and PD2), between the power source voltage $V_{DD}$ and the ground potential $V_{SS}$ form a storage element such that mutual outputs are connected to inputs of the counterparts. Two transfer gates PG1 and PG2 and two transfer gates PG1b and PG2b are connected to each of two storage nodes of the storage element. The writing word line WWL and the writing bit lines WBLt and WBLb corresponding to one writing dedicated port and the reading word line RWL and the reading bit lines RBLt and RBLb corresponding to the other reading dedicated port are disposed.

The writing word line WWL is connected to gate terminals of the transfer gates PG1 and PG1b, and if the writing word line WWL is activated, the storage nodes of the memory cell 2 are electrically connected to the writing bit lines WBLt and WBLb, the reading word line RWL is connected to gate terminals of the transfer gates PG2 and PG2b, and if the reading word line RWL is activated, the storage nodes of the memory cell 2 are electrically connected to the reading bit lines RBLt and RBLb.

Figure 2B:
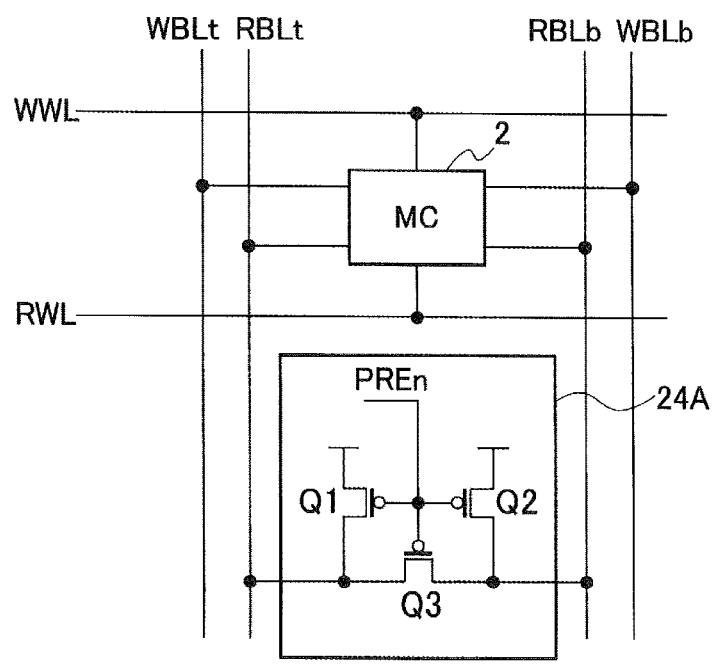
FIG. 2B is a circuit diagram of a two-port memory cell and a precharge circuit of a comparative example.

The typical precharge circuit 24A includes pMOSFETs Q1, Q2, and Q3 as illustrated in FIG. 2B, for example. Each of the pMOSFETs Q1 and Q2 has one terminal connected to the power source voltage $V_{DD}$ and the other terminal connected to each of complementary bit lines RBLt and RBLb. A main terminal of the pMOSFET Q3 is connected between the bit lines RBLt and RBLb. As a result, if the precharge enable signal PREn is turned into a low level L, both the complementary bit lines RBLt and RBLb are turned into the high level H and are precharged.

Figure 3A:
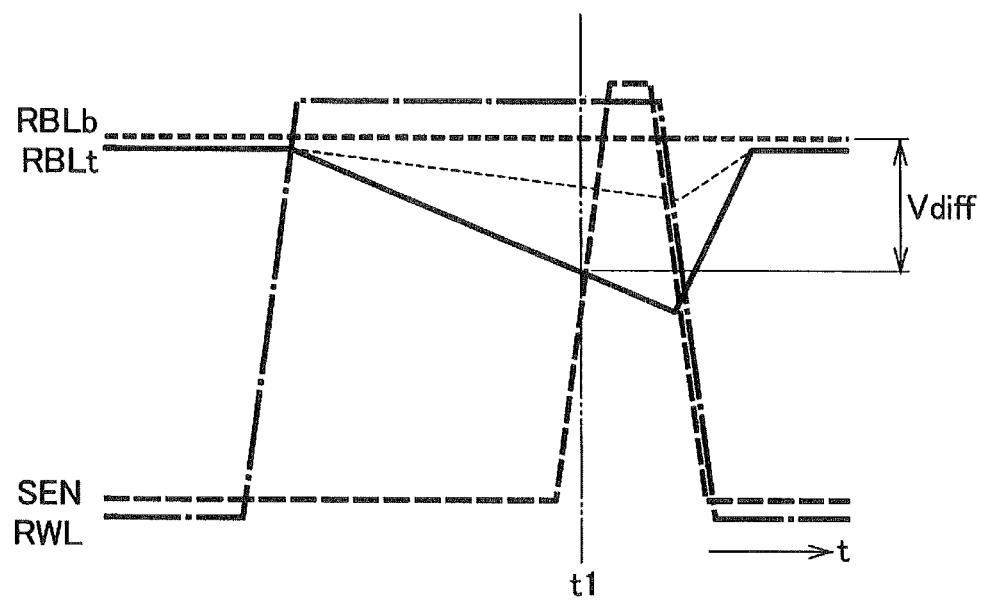
FIG. 3A illustrates a waveform example of bit lines RBLt and RBLb in a normal operation.
Figure 3B:
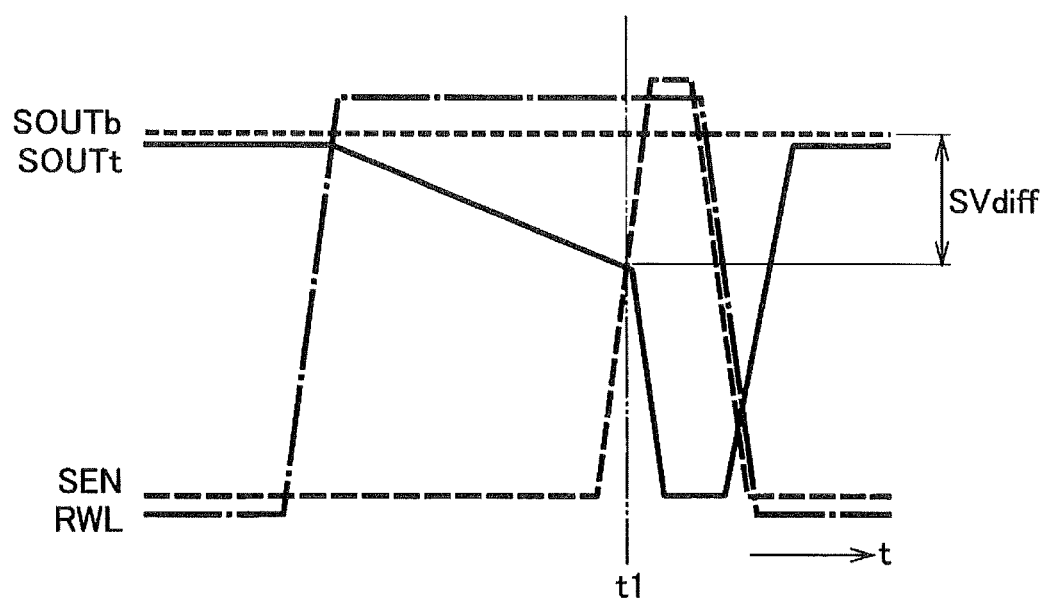
FIG. 3B illustrates a waveform example of sense amplifier outputs SOUTt and SOUTb in the normal operation, in the two-port memory cell.

In the two-port memory cell, an operation waveform example of the bit lines RBLt and RBLb during normal operations is illustrated in FIG. 3A, and an operation waveform example of the sense amplifier outputs SOUTt and SOUTb during the normal operations is illustrated in FIG. 3B. Here, the sense amplifier outputs SOUTt and SOUTb are outputs of the sense amplifier circuit 28 (see FIG. 6) connected to the bit lines RBLt and RBLb and represent outputs after amplifying a differential potential $V_{diff}$ between the bit lines RBLt and RBLb. In FIG. 3A, the potentials of the bit lines RBLt and RBLb are represented as RBLt and RBLb. In FIG. 3B, the potential of the word line RWL is represented as RWL. The same applies to the following description.

If the word line RWL is selected, and a differential voltage between the bit lines RBLt and RBLb increases (RBLb>RBLt) with elapse of time, and the sense amplifier enable signal SEN is turned into the high level H at the time t1, the differential potential Vdiff between the bit lines RBLt and RBLb is amplified by the sense amplifier circuit 28. As for the differential potential $SV_{diff}$ between the sense amplifier outputs SOUTt and SOUTb, the sense amplifier output SOUTb is turned into the high level H and the sense amplifier output SOUTt is turned into the low level L due to a latch-up operation of the sense amplifier circuit 28. In this case, since the sense amplifier output SOUTt is turned into the low level L, the two-port memory cell operates normally.

Figure 4A:
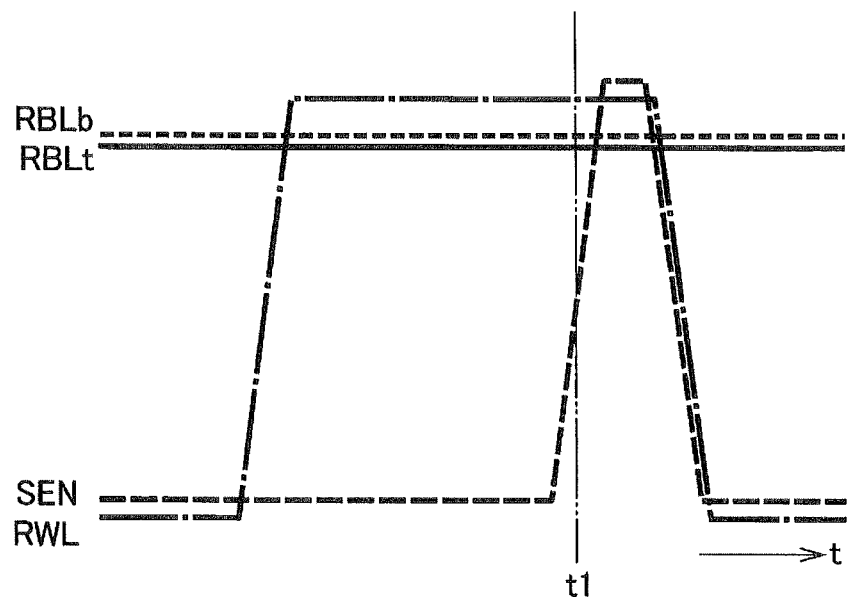
FIG. 4A illustrates a waveform example of bit lines RBLt and RBLb in an error operation involving an open circuit failure.
Figure 4B:
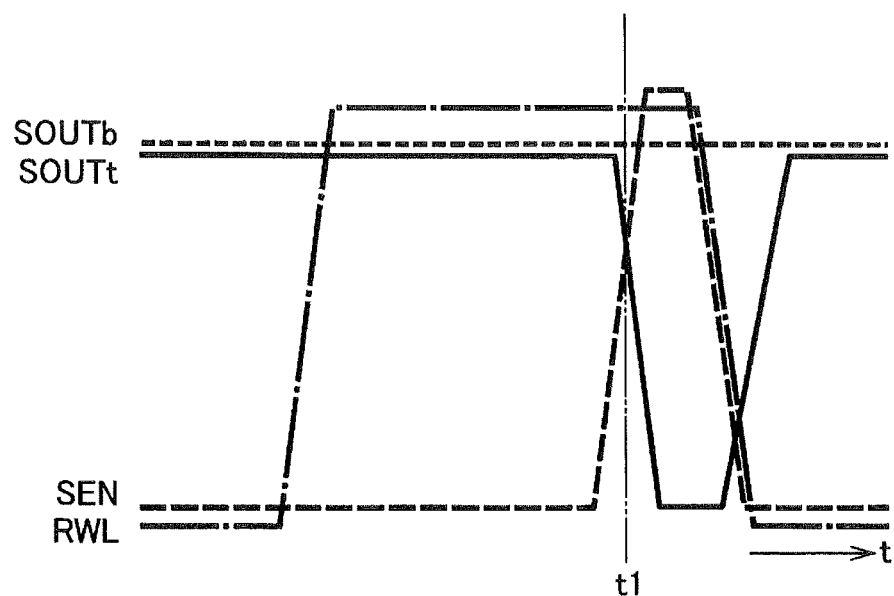
FIG. 4B illustrates a waveform example of sense amplifier outputs SOUTt and SOUTb in the error operation involving the opening failure, in the two-port memory cell.

In the two-port memory cell, an operation waveform example of the bit lines RBLt and RBLb during an error operation that accompanies an opening failure is illustrated in FIG. 4A, and an operation waveform example of the sense amplifier outputs SOUTt and SOUTb during an error operation that accompanies an opening failure is illustrated in FIG. 4B.

If the word line RWL is selected, and the sense amplifier enable signal SEN is turned into the high level H at the time t1 even in a state in which the differential potential of the bit lines RBLt and RBLb does not increase (RBLb=RBLt) with elapse of time, the sense amplifier output SOUTb may be turned into the high level H, and the sense amplifier output SOUTt may be turned into the low level L due to bias of the sense amplifier circuit 28. In this case, since the sense amplifier output SOUTt is turned into the low level L, it is determined that a product is a normal product (accepted) regardless of the situation in which the two-port memory cell is erroneously operating. Such an error operation can occur due to bias of the sense amplifier circuit 28 in a case of an opening failure at a node A of the transfer gate PG2b in the circuit of the two-port memory cell 2 in FIG. 2A, for example.

In a case in which the bit line and an internal node of the memory cell are not connected to each other, an ordinary one-port SRAM cannot perform a writing operation, which leads to a failure. However, since a reading dedicated port is present in a two-port SRAM, a product in such a state as illustrated in FIG. 4B is also determined to be an accepted product.

Figure 5A:
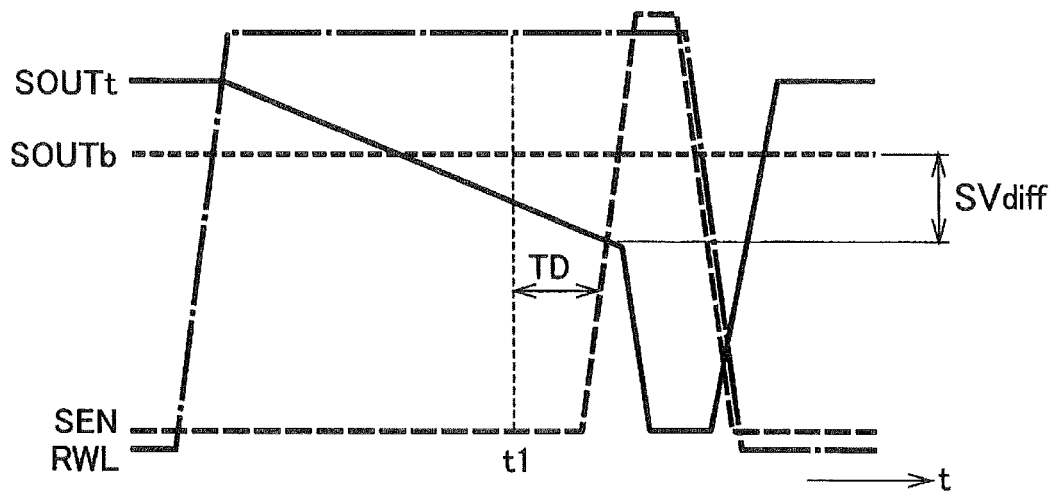
FIG. 5A illustrates a waveform example of sense amplifier outputs SOUTt and SOUTb in a normal operation.
Figure 5B:
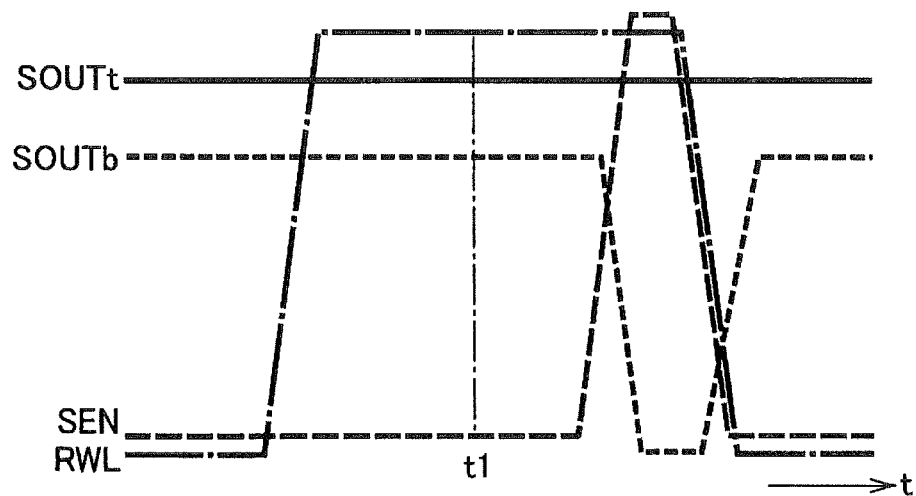
FIG. 5B illustrates a waveform example of sense amplifier outputs SOUTt and SOUTb for a defective product with an opening failure, in the two-port memory cell applicable to the semiconductor storage device according to the embodiment.

In the two-port memory cell applicable to the semiconductor storage device according to the embodiment, an operation waveform example of the sense amplifier outputs SOUTt and SOUTb during an operation in which the product is determined to be a normal product is illustrated in FIG. 5A, and an operation waveform example of the sense amplifier outputs SOUTt and SOUTb in which the product is determined to be a defective product that accompanies an opening failure is illustrated in FIG. 5B.

If the word line RWL is selected, the differential voltage (RBLb>RBLt) between the bit lines RBLt and RBLb increases, and the sense amplifier enable signal SEN is turned into the high level H at a time t1+TD, the differential voltage $V_{diff}$ between the bit lines RBLt and RBLb is amplified by the sense amplifier circuit 28.

Here, the differential voltage $SV_{diff}$ between the sense amplifier outputs SOUTt and SOUTb is amplified by the sense amplifier circuit 28 as illustrated in FIG. 5A. In this manner, the sense amplifier output SOUTb is turned into the high level H, and the sense amplifier output SOUTt is turned into the low level L. In this case, since the sense amplifier output SOUTtb is turned into the low level L, the two-port memory cell would be determined to be a non-defective product, that is such a device/product would be accepted according to manufacturing tolerances or the like.

In contrast, the differential potential $SV_{diff}$ between the sense amplifier outputs SOUTt and SOUTb is amplified by the sense amplifier circuit 28 as illustrated in FIG. 5B. In this manner, the sense amplifier output SOUTb is turned into the low level L, and the sense amplifier output SOUTt is turned into the high level H. In this case, since the sense amplifier output SOUTtb is turned into the high level H, the two-port memory cell would be determined to be a defective product (according to the presence of an opening failure).

Here, a delay time TD represents a delay time with which the sense amplifier enable signal SEN is delayed and operations of the sense amplifier circuit 28 are delayed. The delay time TD is determined such that the differential voltage between the bit lines RBLt and RBLb is equal to or greater than the threshold voltage $V_{diff}$. At this time, the differential voltage between the sense amplifier outputs SOUTt and SOUTb is represented as $SV_{diff}$. The delay time TD is generated by the delay circuit 40 (see FIG. 9).

In the two-port memory cell applicable to the semiconductor storage device according to the embodiment, it is possible to avoid an erroneous operation by lowering a precharge level of a bit line on the opposite side of the data to be read relative to a precharge level of the bit line for the data to be read and thus determining that the product is a defective product (with an opening failure) even when the sense amplifier circuit is iased. For the timing of the sense amplifier enable signal SEN, ordinary data is appropriately read by performing reading at a timing of the delay time TD that is sufficiently later than an ordinary timing.

Input/output Circuit

Figure 6:
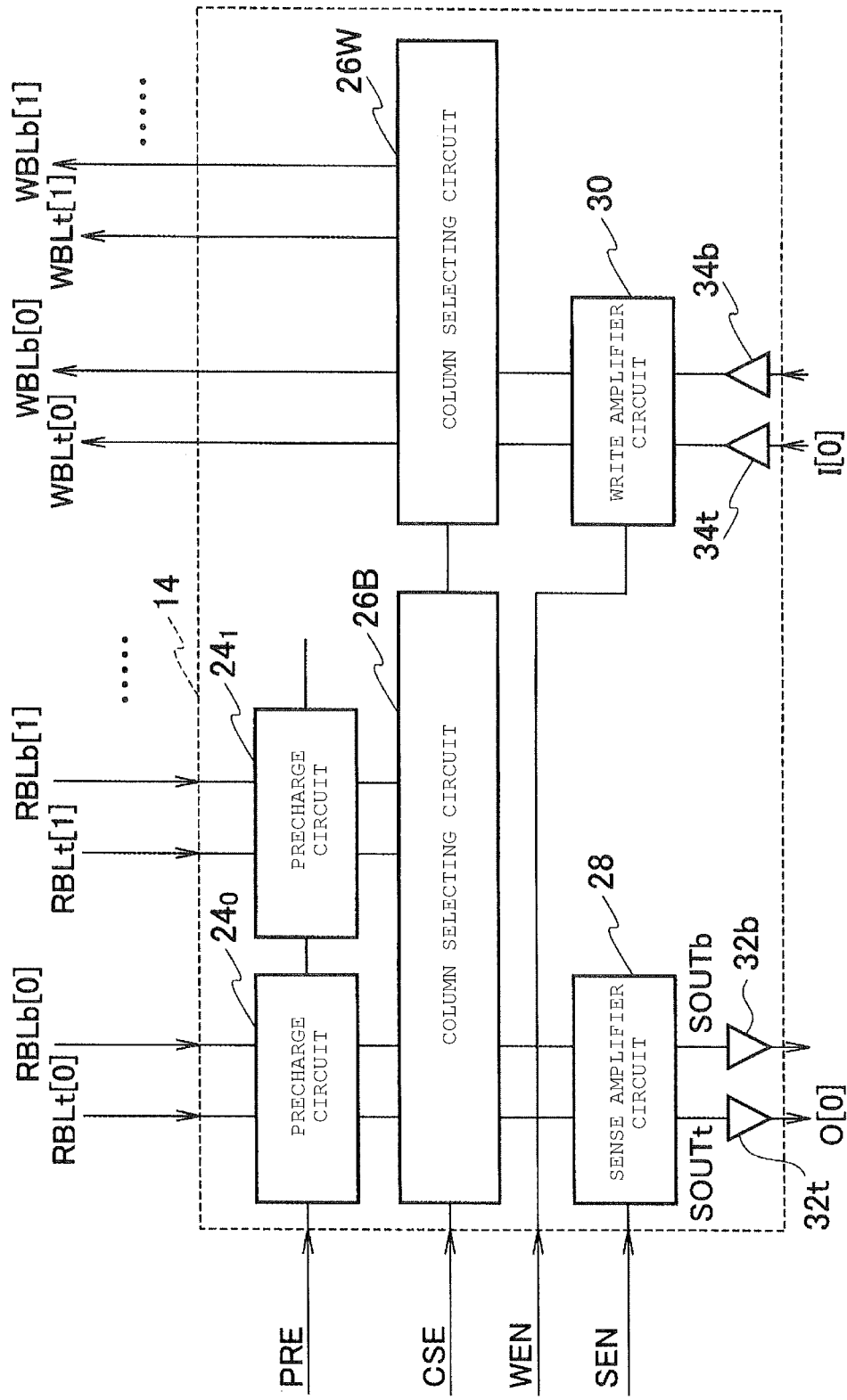
FIG. 6 is a block diagram illustrating a schematic configuration example of an input/output circuit applicable to the semiconductor storage device according to the embodiment.

The input/output circuit 14 applicable to the semiconductor storage device 10 according to the embodiment includes precharge circuits $24_0$, $24_1$ . . . , a column selecting circuit 26B for a bit line, a column selecting circuit 26W for a word line, the sense amplifier circuit 28, a write amplifier circuit 30, buffers 32t and 32b, and buffers 34t and 34b as illustrated in FIG. 6.

The precharge circuits $24_0$, $24_1$ . . . , are connected to a plurality of bit line pairs RBLt [0], RBLb [0], RBLt [1], RBLb [1] . . . and are driven by a precharge enable signal PRE.

The column selecting circuit 26B for a bit line is connected to the precharge circuits $24_0$, $24_1$ . . . and is driven by a column selecting signal CSE.

The column selecting circuit 26W for a word line is connected to a plurality of word line pairs WBLt [0], WBLb [0], WBLt [1], WBLb [1] . . . and the column selecting circuit 26B and is driven by the column selecting signal CSE.

The sense amplifier circuit 28 is connected to the column selecting circuit 26B for a bit line and is driven by a sense amplifier enable signal SEN.

The write amplifier circuit 30 is connected to the column selecting circuit 26W and is driven by a writing enable signal WEN.

The buffers 32t and 32b are driven by the sense amplifier outputs SOUTt and SOUTb of the sense amplifier circuit 28. Outputs of the buffers 32t and 32b become an output signal O[0] of the input/output circuit 14.

The buffers 34t and 34b are connected to the write amplifier circuit 30. Inputs of the buffers 34t and 34b become an input signal I[0] of the input/output circuit 14.

Figure 7:
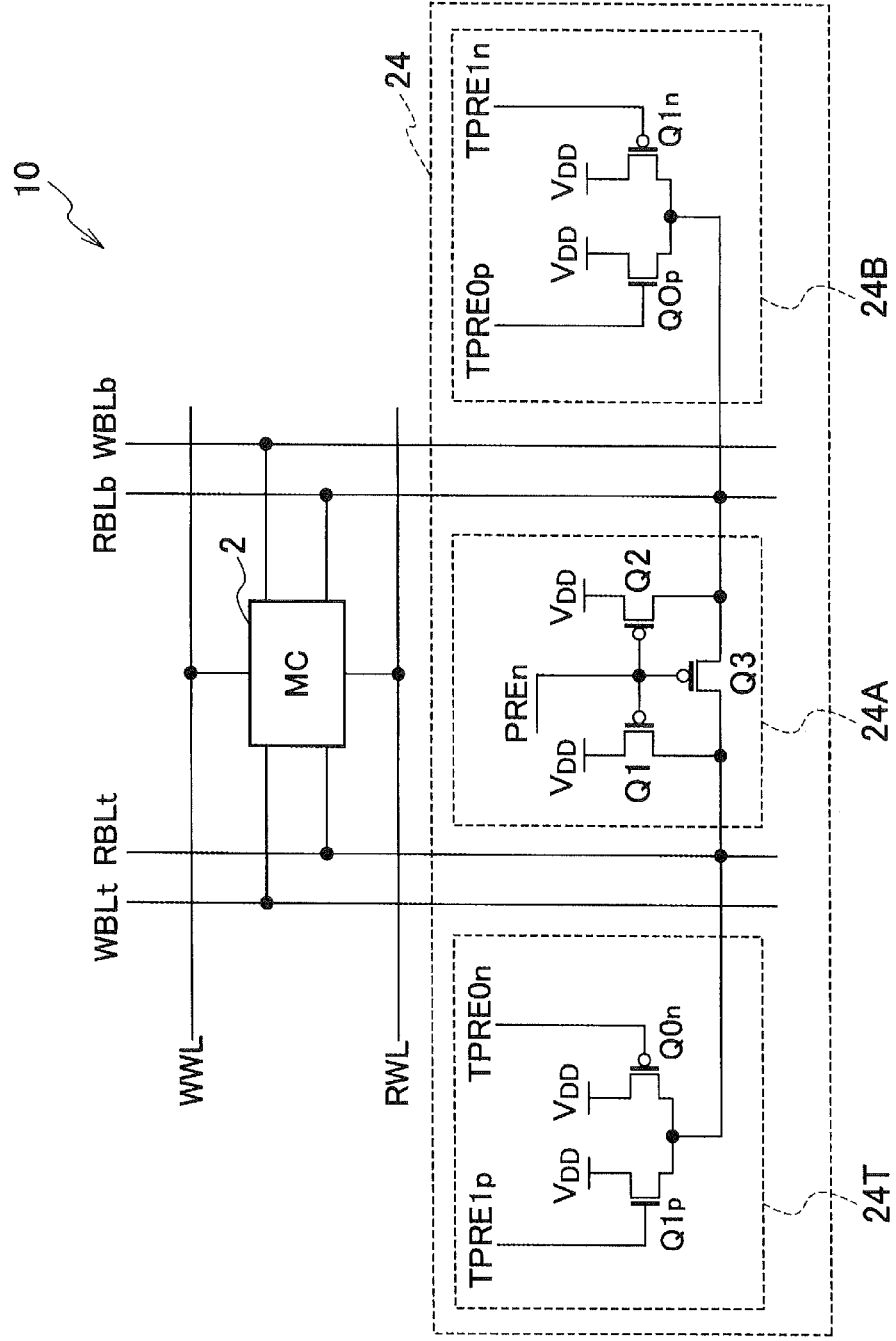
FIG. 7 is a configuration example of a precharge circuit applicable to the semiconductor storage device according to the embodiment.

Precharge Circuit (FIG. 7)

The semiconductor storage device 10 according to the embodiment includes the memory cell 2, a reading dedicated port that is selected by the reading word line RWL and performs only reading of data, and the precharge circuit 24 configured to precharge the bit lines RBLt and RBLb with the respectively different potentials during a test, as illustrated in FIG. 7.

The precharge circuit 24 applicable to the semiconductor storage device 10 according to the embodiment includes pMOSFETs Q0n and Q1n that supply a power source level to one of the bit lines and nMOSFETs Q0p and Q1p that supply a level below a threshold voltage from the power source to the other one of the bit lines, and has a function of delaying an operation timing of the sense amplifier circuit 28 during the test.

The precharge circuit 24 includes the precharge circuit 24A, a precharge circuit 24T for the bit line RBLt, and a precharge circuit 24B for the bit line RBLb as illustrated in FIG. 7. Here, the precharge circuit 24 applicable to a precharge circuit $24_1$, $24_2$ . . . illustrated in FIG. 6.

The precharge circuit 24A includes pMOSFETs Q1, Q2, and Q3 similarly to FIG. 2B. Each of the pMOSFETs Q1 and Q2 has one terminal connected to the power source voltage $V_{DD}$ and the other terminal connected to each of complementary bit lines RBLt and RBLb. A main terminal of the pMOSFET Q3 is connected between the bit lines RBLt and RBLb. If the precharge enable signal PREn is turned into the low level L, both the complementary bit lines RBLt and RBLb are turned into the high level H and are precharged.

The precharge circuit 24T includes an nMOSFET Q1p that has one main terminal connected to the power source voltage $V_{DD}$ and the other main terminal connected to the bit line RBLt and a pMOSFET Q0n that is connected in parallel to the nMOSFET Q1p and has one main terminal connected to the power source voltage $V_{DD}$ and the other main terminal connected to the bit line RBLt as illustrated in FIG. 7.

The precharge circuit 24B includes an nMOSFET Q0p that has one main terminal connected to the power source voltage $V_{DD}$ and the other main terminal connected to the bit line RBLb and a pMOSFET Q1n that is connected in parallel to the nMOSFET Q0p and has one main terminal connected to the power source voltage $V_{DD}$ and the other main terminal connected to the bit line RBLb as illustrated in FIG. 7.

Suffixes n and p of the precharge enable signal PREn and the precharge gate signals TPRE1p, TPRE1n, TPRE0p, and TPRE0n mean as follows. That is, n is added to the signal that becomes valid in the level L, and p is added to the signal that becomes valid in the level H. TPRE1 indicates a precharge gate signal for a data "1" test, and TPRE0 indicates a precharge gate signal for a data "0" test.

Precharge Operation (FIG. 8)

As illustrated in FIG. 8A, if the precharge enable signal PREn is brought into the low level L, each of the complementary bit lines RBLt and RBLb is precharged to the high level H.

Next, precharge for a data "0" reading test operation is performed. That is, if the precharge gate signal TPRE0n for the pMOSFET Q0n is brought into the low level L and the precharge gate signal TPRE0p for the nMOSFET Q0p is brought into the high level H as illustrated in FIG. 8B, the bit line RBLt is precharged to the high level H, and the bit line RBLb is precharged to the high level H-Vt. Here, Vt is a threshold voltage of the nMOSFET Q0p. That is, it is possible to execute the data "0" reading test operation by precharging the bit line RBLt to the high level H and precharging the bit line RBLb to a potential level that is lowered than the high level H by the threshold voltage Vt.

The precharge circuit 24 can lower the precharge level of the bit line RBLb in a complementary relationship with the bit line RBLt relative to the precharge level of the bit line RBLt of the data "0" to be read in the reading bit line pair.

In the two-port memory cell applicable to the semiconductor storage device according to the embodiment, the product is determined to be a defective product (with an opening failure) during the data "0" reading test operation even if the sense amplifier circuit 28 is inclined, by lowering the precharge level of the bit line RBLb on the opposite side of the data to be read relative to the precharge level of the bit line RBLt1 of the data "0" to be read.

Next, precharge for a data "1" reading test operation is performed. That is, if the precharge gate signal TPRE1p for the nMOSFET Q1p is brought into the high level H, and the precharge gate signal TPRE1n for the pMOSFET Q1n is brought into the low level L as illustrated in FIG. 8C, the bit line RBLt is precharged to the high level H-Vt, and the bit line RBLb is precharged to the high level H. Here, Vt is a threshold voltage of the nMOSFET Q1p. That is, it is possible to execute the data "1" reading test operation by precharging the bit line RBLt to the potential level H-Vt that is lower than the high level H by the threshold voltage Vt and precharging the bit line RBLb to the high level H.

The precharge circuit 24 can lower the precharge level of the bit line RBLt in the complementary relationship with the bit line RBLb relative to the precharge level of the bit line RBLb for the data "1" to be read in the reading bit line pair.

In the two-port memory cell applicable to the semiconductor storage device according to the embodiment, the product is determined to be a defective product (with an opening failure) during the data "1" reading test operation even when the sense amplifier circuit 28 is inclined by lowering the precharge level of the bit line RBLt on the opposite side of the data to be read relative to the precharge level of the bit line RBLb of the data "1" to be read.

Reading Control Circuit

Figure 9A:
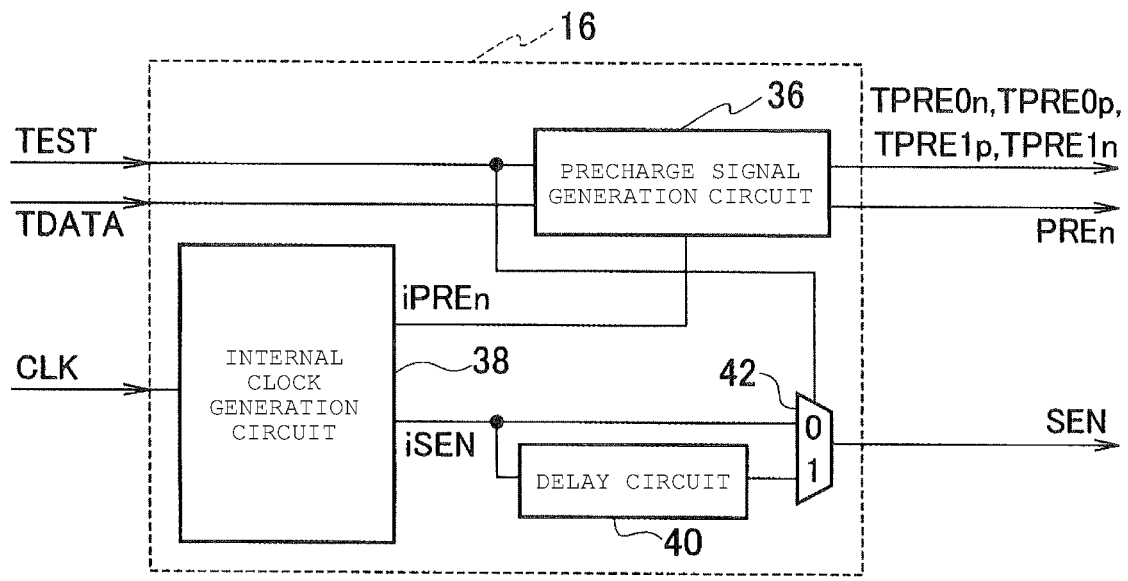
FIG. 9A is a block diagram illustrating a schematic configuration example of a reading control circuit applicable to the semiconductor storage device according to the embodiment.

The reading control circuit 16 applicable to the semiconductor storage device 10 according to the embodiment includes a precharge signal generation circuit 36, an internal clock generation circuit 38, a delay circuit 40, and a selector 42 as illustrated in FIG. 9A.

The internal clock generation circuit 38 is driven by an external clock signal CLK and outputs an internal precharge enable signal iPREn and an internal sense amplifier enable signal iSEN. The internal precharge enable signal iPREn is supplied to the precharge signal generation circuit 36 and drives the precharge signal generation circuit 36.

A test signal TEST and a test data signal TDATA are supplied to the precharge signal generation circuit 36, and the precharge signal generation circuit 36 outputs a precharge enable signal PREn and precharge gate signals TPRE0n, TPRE0p, TPRE1p, and TPRE1n.

The internal sense amplifier enable signal iSEN is connected to a 0 input of the selector 42 and is connected to a 1 input of the selector 42 via the delay circuit 40. The 0 input and the 1 input of the selector 42 are selected using a test signal TEST. As a result, the sense amplifier enable signal SEN is output from an output of the selector 42.

Figure 9B:
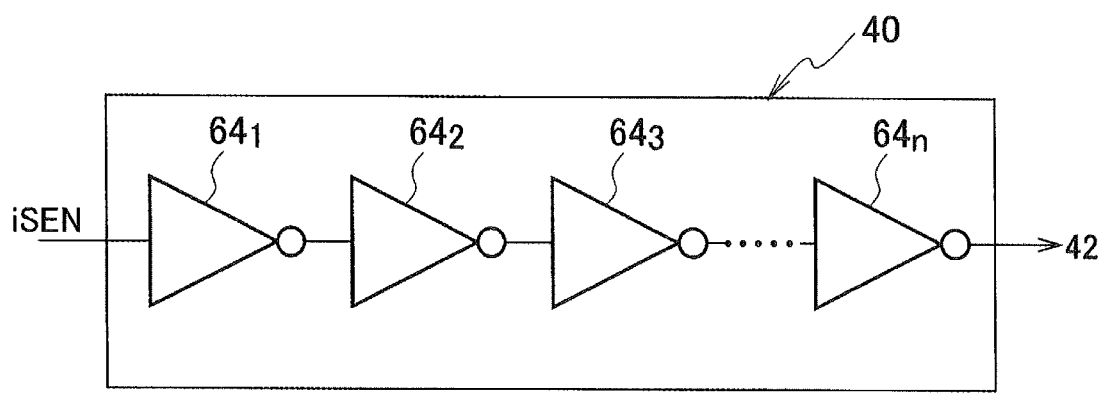
FIG. 9B is a circuit diagram illustrating a schematic example of a delay circuit.

As illustrated in FIG. 9B, the delay circuit 40 may include a serial circuit of a plurality of inverters $64_1$, $64_2$, $64_3$, . . . , $64_n$. It is possible to delay the timing of the sense amplifier enable SEN by the delay time TD as illustrated by the waveform in FIG. 5A with the delay circuit 40.

Precharge Signal Generation Circuit

Figure 10:
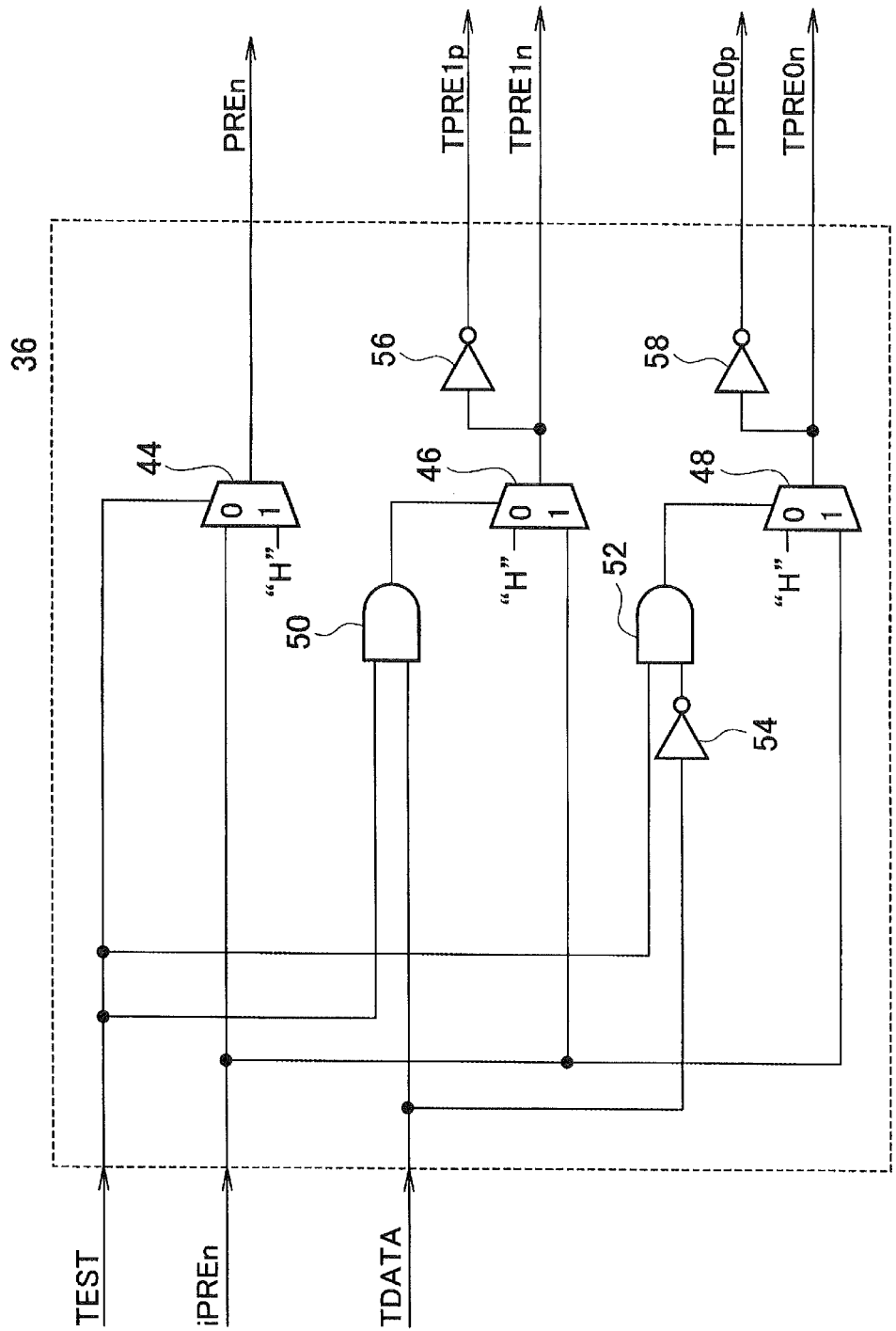
FIG. 10 is a logical circuit diagram illustrating a configuration example of a precharge signal generation circuit in the reading control circuit in the semiconductor storage device according to the embodiment.
Figure 11:
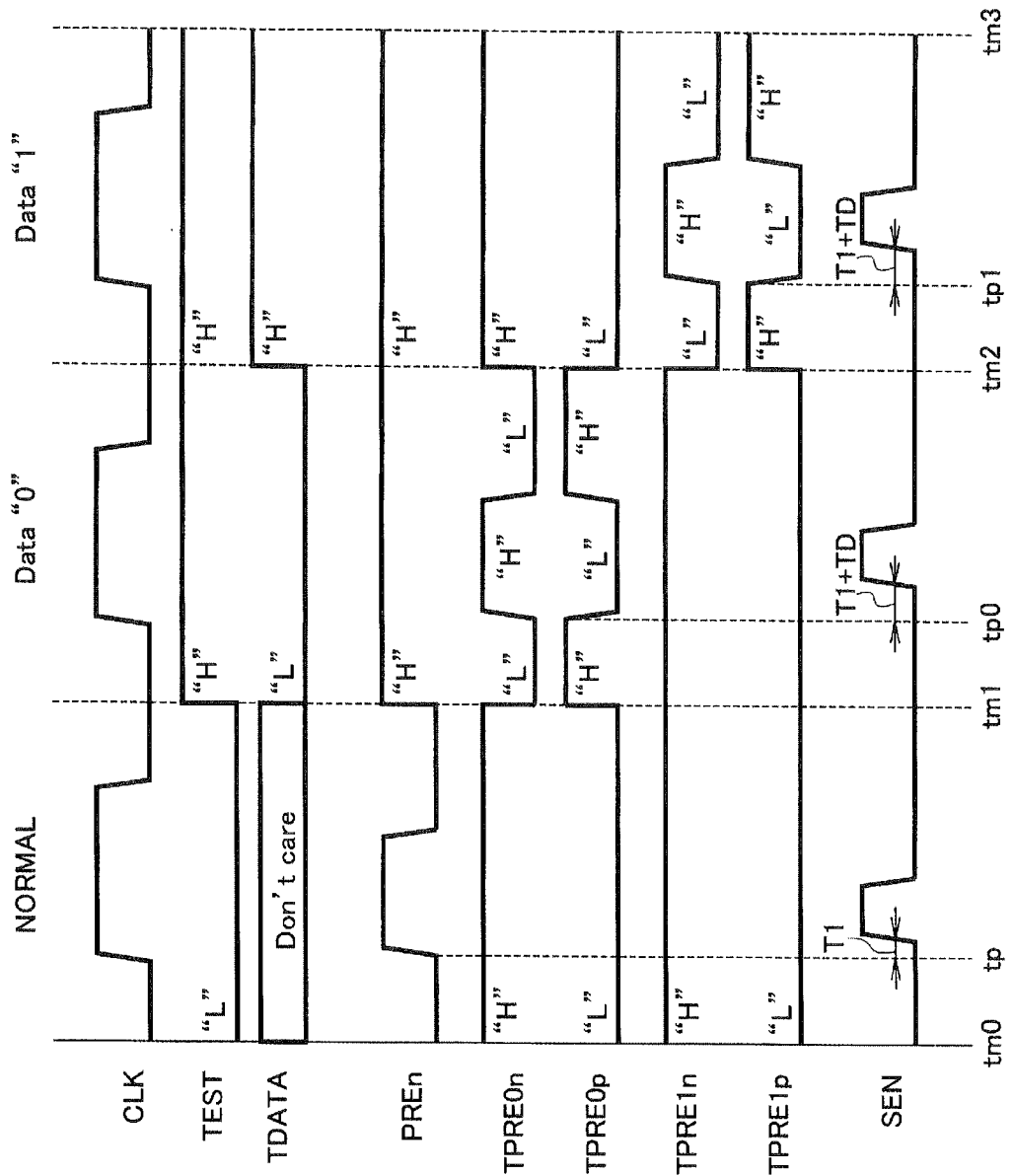
FIG. 11 illustrates a waveform example of the precharge signal generation circuit in the semiconductor storage device according to the embodiment.

In the semiconductor storage device 10 according to the embodiment, a circuit configuration of the precharge signal generation circuit 36 is illustrated in FIG. 10, and an operation waveform of the precharge signal generation circuit 36 is illustrated in FIG. 11. FIG. 11 also illustrates the sense amplifier enable signal SEN. In FIG. 11, a period from time tm0 to a time tm1 represents an ordinary operation period, a period from the time tm1 to a time tm2 represents a data "0" test period, and a period from the time tm2 to a time tm3 represents a data "1" test period.

The test signal TEST is turned into the low level L in the ordinary operation (NORMAL) and is turned into the high level H in the data "0" test and the data "1" test.

The test data signal TDATA may be either in the high level H or the low level L in the ordinary operation, the test data signal TDATA is turned into the low level L in the data "0" test and is turned into the high level H in the data "1" test.

If the precharge enable signal PREn is obtained from the output of the selector 44. The precharge enable signal PREn is an output synchronized with the clock signal CLK in the ordinary operation. The internal precharge enable signal iPREn is input to the 0 input of the selector 44. An H level signal is input to the 1 input of the selector 44. If the test signal TEST is turned into the level H, and the selector 44 is selected, the precharge enable signal PREn is turned into the level H both during the data "0" test and during the data "1" test.

The precharge gate signal TPRE1n is obtained from the output of the selector 46, and the precharge gate signal PRE1p is obtained as an output obtained by inverting the output of the selector 46 by an inverter 56. The internal precharge enable signal iPREn is input to the 1 input of the selector 46, and the H level signal is input to the 0 input of the selector 46. An output of the AND gate 50 to which the test signal TEST and the test data signal TDATA are input is input to the selector 46 and selects the selector 46.

The precharge gate signal TPRE0n is obtained from the output of the selector 48, and the precharge gate signal TPRE0p is obtained as an output obtained by inverting the output of the selector 48 using the inverter 58. The internal precharge enable signal iPREn is input to the 1 input of the selector 48, and the H level signal is input to the 0 input of the selector 48. An output of the AND gate 52 to which the test signal TEST and the output signal from the inverter 54 of the test data signal TDATA are input is input to the selector 48, and the selector 48 is selected.

Ordinary Operation

As illustrated in FIG. 11, the precharge gate signal TPRE0n is turned into the high level H, the precharge gate signal TPRE0p is turned into the low level L, the precharge gate signal TPRE0n is turned into the high level H, and the precharge gate signal PRE1p is turned into the low level L, and an ordinary memory operation is executed while the precharge circuits 24T and 24B in FIG. 7 do not operate in the ordinary operation in the period from the time tm0 to the time tm1. The time tp indicates a timing at which the precharge enable signal PREn rises in the ordinary operation. A time T1 until the sense amplifier enable signal SEN reaches the high level after the time tp corresponds to a delay time for reading of the sense amplifier in the ordinary operation as illustrated in FIG. 11.

Data "0" Test Operation

As illustrated in FIG. 11, the precharge circuits 24T and 24B in FIG. 7 execute the data "0" test operation by turning the precharge gate signal TPRE0n into the low level L and turning the precharge gate signal TPRE0p into the high level H in the data "0" test operation from the time tm1 to the time tm2. As a result, the bit line RBLt is turned into the high level H, and the bit line RBLb is turned into the high level H-Vt. As illustrated in FIG. 11, the time tp0 represents a timing of rising of the precharge gate signal TPRE0n in the data "0" test operation, and at the same time, represents a timing of falling of the precharge gate signal TPRE0p. The time T1+TD until the sense amplifier enable signal SEN is turned into the high level after the time tp0 is a delay time of the reading of the sense amplifier in the data "0" test mode.

Next, a normal memory operation is executed, the precharge gate signal TPRE0n is brought into the low level L again, and the precharge gate signal TPRE0p is brought into the high level H by bringing the precharge gate signal TPRE0n into the high level H and bringing the precharge gate signal TPRE0p into the low level L in a predetermined pulse period. Meanwhile, the precharge gate signal TPRE1n is maintained in the high level H, the precharge gate signal PRE1p is maintained in the low level L, and the nMOSFET Q1p and the pMOSFET Q1n are in the OFF state.

Data "1" Test Operation

As illustrated in FIG. 11, the precharge circuits 24T and 24B in FIG. 7 execute the data "1" test operation by bringing the precharge gate signal TPRE1n into the low level L and bringing the precharge gate signal TPRE1p into the high level H in the data "1" test operation from the time tm2 to the time tm3. As a result, the bit line RBLt is turned into the high level H-Vt, and the bit line RBLb is turned into the high level H. As illustrated in FIG. 11, the time tp1 represents a timing of rising of the precharge gate signal TPRE1n in the data "1" test operation, and at the same time, represents a timing of a falling of the precharge gate signal TPRE1p. The time T1+TD until the sense amplifier enable signal SEN reaches the high level after the time tp1 corresponds to a delay time of reading of the sense amplifier in the data "1" test mode.

Next, a normal memory operation is executed, the precharge gate signal TPRE1n is brought into the low level L again, and the precharge gate signal TPRE1p is brought into the high level H by bringing the precharge gate signal TPRE1n into the high level H and bringing the precharge gate signal TPRE1p into the low level L in a predetermined pulse period. Meanwhile, the precharge gate signal TPRE0n is maintained in the high level H, the precharge gate signal PRE0p is maintained in the low level L, and the pMOSFET Q0n and the pMOSFET Q0p are in the OFF state.

Figure 12:
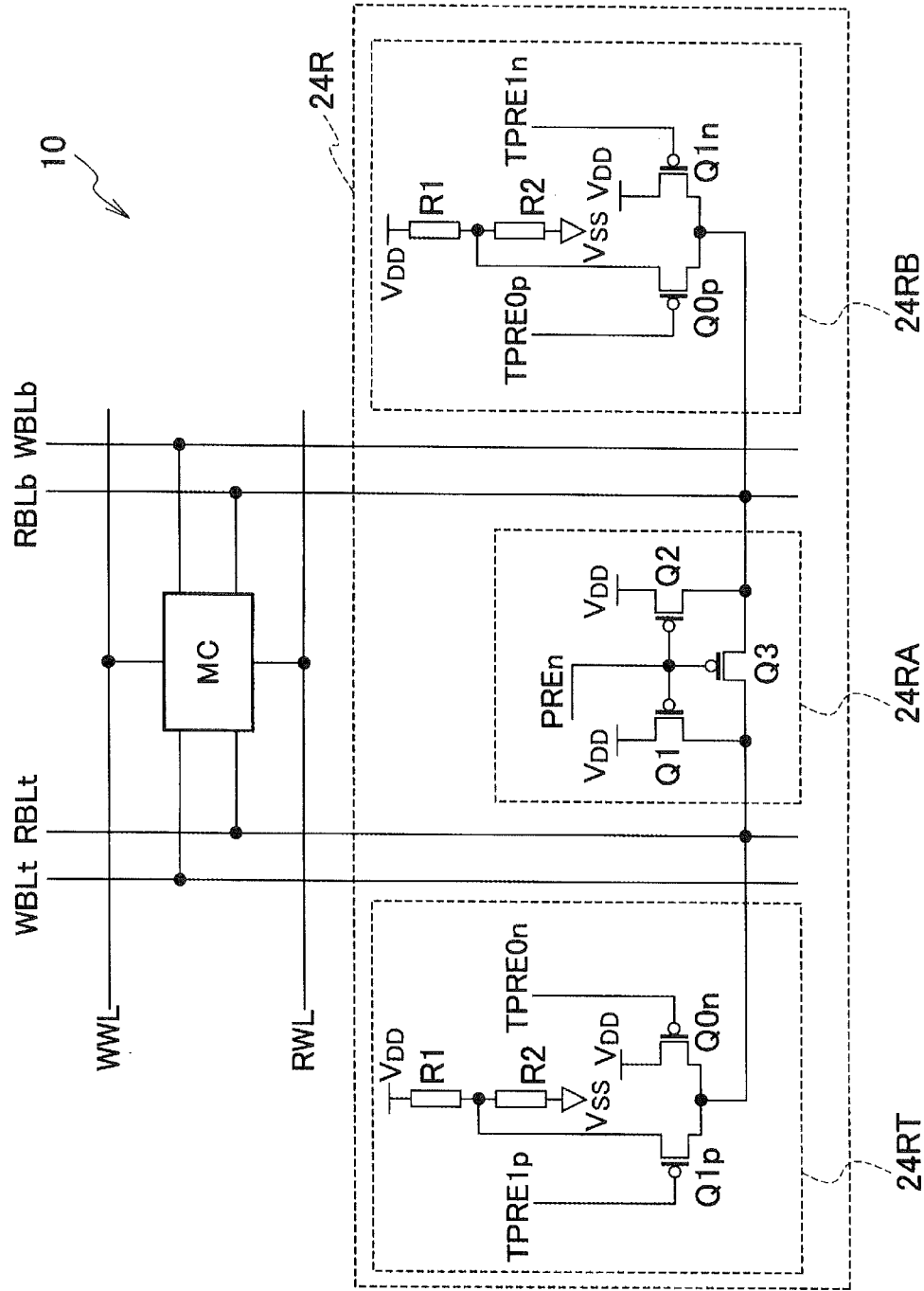
FIG. 12 is a circuit diagram illustrating a configuration example of another precharge circuit applicable to the semiconductor storage device according to the embodiment.

Precharge Circuit (FIG. 12)

As illustrated in FIG. 12, the semiconductor storage device 10 according to the embodiment includes the memory cell 2, the reading dedicated port that is selected by the reading word line RWL and performs only reading of data, and a precharge circuit 24R configured to precharge the bit lines RBLt and RBLb with the respectively different potentials during the test.

The precharge circuit 24R applicable to the semiconductor storage device 10 according to the embodiment includes pMOSFETs Q0n and Q1n that supplies a power source level to one of the bit lines and pMOSFETs Q0p and Q1p that supplies a level obtained through resistance division from the power source to the other one of the bit lines and has a function of delaying the operation timing of the sense amplifier circuit 28 during the test.

As illustrated in FIG. 12, the precharge circuit 24R includes a precharge circuit 24RA, a precharge circuit 24RT for the bit line RBLt, and a precharge circuit 24RB for the bit line RBLb. Here, the precharge circuit 24R may be applied to the precharge circuits $24_0$, $24_1$ . . . illustrated in FIG. 6.

The precharge circuit 24RA includes pMOSFETs Q1, Q2, and Q3 similarly to FIG. 2B. Each of the pMOSFETs Q1 and Q2 has one terminal connected to the power source voltage $V_{DD}$ and the other terminal connected to each of the complementary bit lines RBLt and RBLb. A main terminal of the pMOSFET Q3 is connected between the bit lines RBLt and RBLb. As a result, if the precharge enable signal PREn is turned into the low level L, both the complementary bit lines RBLt and RBLb are turned into the high level H and are precharged.

The precharge circuit 24RT has a pMOSFET Q1p that has one main terminal to which a potential level obtained by dividing the power source voltage $V_{DD}$ with resistances R1 and R2 is supplied and the other main terminal connected to the bit line RBLt and a pMOSFET Q0n that has one main terminal to which the power source voltage $V_{DD}$ is supplied and the other main terminal connected to the bit line RBLt as illustrated in FIG. 12.

The precharge circuit 24RB includes a pMOSFET Q0p that has one main terminal to which a potential level obtained by dividing the power source voltage $V_{DD}$ with the resistances R1 and R2 is supplied and the other main terminal connected to the bit line RBLb and a pMOSFET Q1n that has one main terminal to which the power source voltage $V_{DD}$ is supplied and the other main terminal connected to the bit line RBLb as illustrated in FIG. 12.

Precharge Operation (FIG. 13)

As illustrated in FIG. 13A, if the precharge enable signal PREn is brought into the low level L, the complementary bit lines RBLt and RBLb are respectively precharged to the high level H.

Next, precharge for the data "0" reading test operation is performed. That is, if the precharge gate signal TPRE0n for the pMOSFET Q0n is brought into the low level L, and the precharge gate signal TPRE0p for the pMOSFET Q0p is brought into the high level H, as illustrated in FIG. 13B, the bit line RBLt is precharged to the high level H, and the bit line RBLb is precharged to the high level aH (<H). Here, a is equal to a value R2/(R1+R2) of a resistance division ratio. That is, it is possible to execute the data "0" reading test operation by precharging the bit line RBLt to the high level H and precharging the bit line RBLb to a potential level $aV_{DD}$ obtained by dividing the voltage with a resistance division ratio a from the high level H.

The precharge circuit 24R can lower the precharge level of the bit line RBLb in a complementary relationship with the bit line RBLt relative to the precharge level of the bit line RBLt for the data "0" to be read in the reading bit line pair.

In the two-port memory cell applicable to the semiconductor storage device according to the embodiment, the product is determined to be a defective product (with an opening failure) during the data "0" reading test operation even when the sense amplifier circuit 28 is inclined by lowering the precharge level of the bit line RBLb on the opposite side of the data to be read relative to the precharge level of the bit line RBLt1 of the data "0" to be read.

Next, precharge for the data "1" reading test operation is performed. That is, if the precharge gate signal TPRE1p for the pMOSFET Q1p is brought into the high level H, and the precharge gate signal TPRE1n for the pMOSFET Q1n is brought into the low level L as illustrated in FIG. 13C, the bit line RBLt is precharged to the high level aH (<H), and the bit line RBLb is precharged to the high level H. That is, it is possible to execute the data "1" reading test operation by precharging the bit line RBLt in the potential level $aV_{DD}$ obtained by dividing the voltage by a resistance division ratio a from the high level H and precharging the bit line RBLb to the high level H.

The precharge circuit 24R can lower the precharge level of the bit line RBLt in a complementary relationship with the bit line RBLb relative to the precharge level of the bit line RBLb for the data "1" to be read in the reading bit line pair.

In the two-port memory cell applicable to the semiconductor storage device according to the embodiment, the product is determined to be a defective product (with an opening failure) during the data "1" reading test operation even when the sense amplifier circuit 28 is inclined by lowering the precharge level of the bit line RBLt on the opposite side of the data to be read relative to the precharge level of the bit line RBLb of the data "1" to be read.

Figure 14:
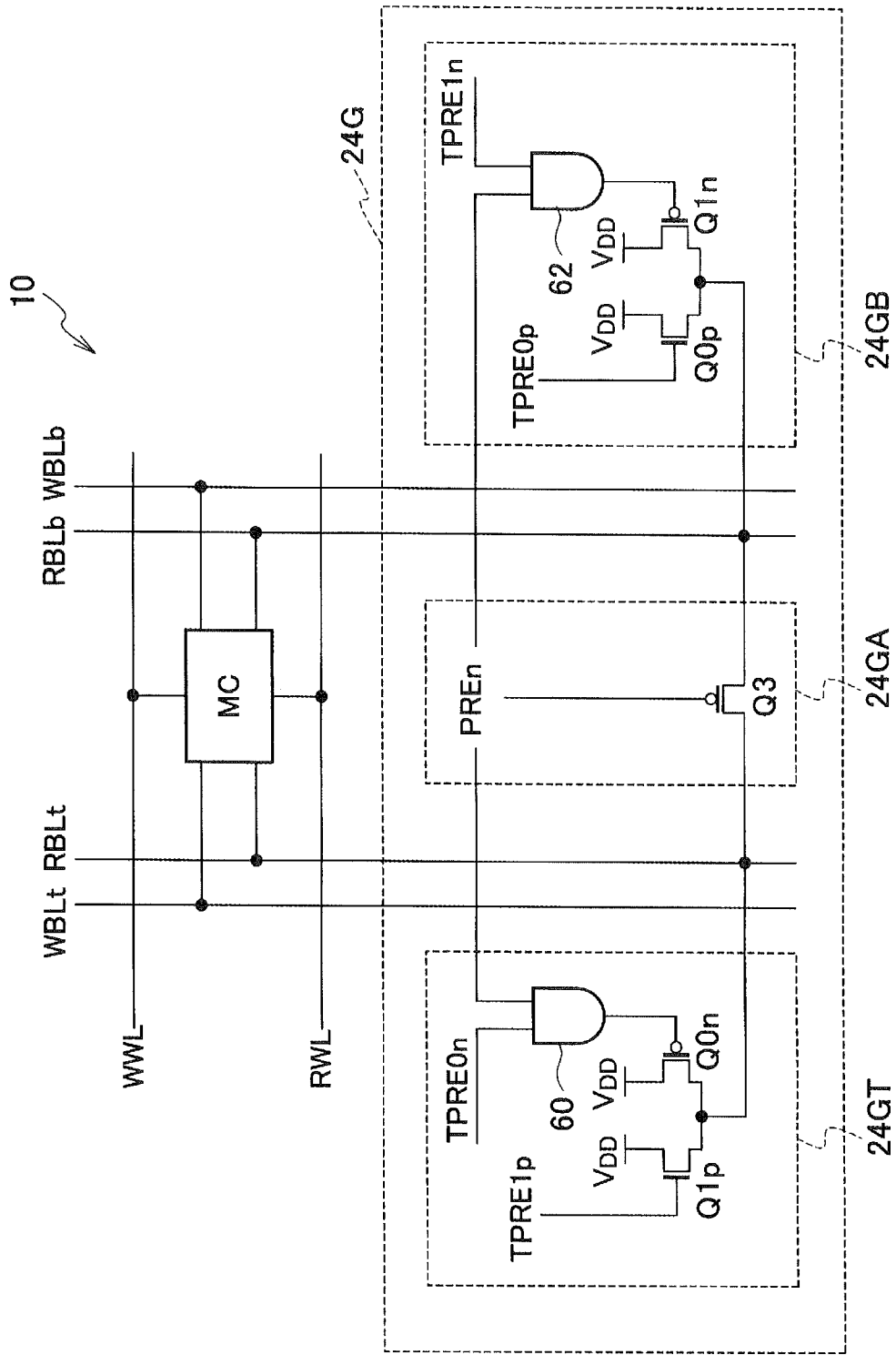
FIG. 14 is a configuration example of yet another precharge circuit applicable to the semiconductor storage device according to the embodiment.

Precharge Circuit (FIG. 14)

As illustrated in FIG. 14, the semiconductor storage device 10 according to the embodiment includes the memory cell 2, the reading dedicated port that is selected by the reading word line RWL and performs only reading of data, and a precharge circuit 24G configured to precharge the bit lines RBLt and RBLb with respectively different potentials during the test.

The precharge circuit 24G that can be applied to the semiconductor storage device 10 according to the embodiment includes pMOSFETs Q0n and Q1n that supply the power source level to one of the bit lines and nMOSFETs Q0p and Q1p that supply a level below a threshold voltage from the power source to the other one of the bit lines and has a function of delaying the operation timing of the sense amplifier circuit 28 during the test.

Here, the precharge circuit 24G shares the pMOSFETs Q0n and Q1n that are used for ordinary precharging and shares the pMOSFETs Q0n and Q1n that are used during the test.

As illustrated in FIG. 14, the precharge circuit 24G includes a precharge circuit 24GA, a precharge circuit 24GT for the bit line RBLt, and a precharge circuit 24GB for the bit line RBLb. Here, the precharge circuit 24G may be applied to the precharge circuits $24_0$, $24_1$ ... illustrated in FIG. 6.

The precharge circuit 24Ga includes a pMOSFET Q3. A main terminal of the pMOSFET Q3 is connected between the bit lines RBLt and RBLb. If the precharge enable signal PREn is turned into the low level L, both the complementary bit lines RBLt and RBLb are turned into the high level H and are precharged.

The precharge circuit 24GT includes an nMOSFET Q1p that has one main terminal to which the power source voltage $V_{DD}$ is supplied and the other main terminal connected to the bit line RBLt and a pMOSFET Q0n that has one main terminal to which the power source voltage $V_{DD}$ is supplied, and the other main terminal connected to the bit line RBLt, and supplies an output signal of the AND gate 60 of the precharge gate signal TPRE0n and the precharge enable signal PREn to the gate, as illustrated in FIG. 14.

The precharge circuit 24GB includes an nMOSFET Q0p that has one main terminal to which the power source voltage $V_{DD}$ is supplied and the other main terminal connected to the bit line RBLb and a pMOSFET Q1n that has one main terminal to which the power source voltage $V_{DD}$ is supplied and the other main terminal connected to the bit line RBLb and supplies an output signal of the AND gate 62 of the precharge gate signal TPRE1n and the precharge enable signal PREn to the gate as illustrated in FIG. 14.

Precharge Operation (FIG. 15)

If the precharge enable signal PREn is brought into the low level L in the precharge circuit 24GA as illustrated in FIG. 15A, the complementary bit lines RBLt and RBLb are respectively precharged to the high level H.

Next, precharge for the data "0" reading test operation is performed. An output of the AND gate 60 of the precharge gate signal TPRE0n and the precharge enable signal PREn is input to the gate of the pMOSFET Q0n. Therefore, if the precharge gate signal TPRE0n for the pMOSFET Q0n is brought into the low level L, and the precharge gate signal TPRE0p for the nMOSFET Q0p is brought into the high level H as illustrated in FIG. 15B, the bit line RBLt is precharged to the high level H, and the bit line RBLb is precharged to the high level H-Vt. Here, Vt is a threshold voltage of the nMOSFET Q0p. That is, it is possible to execute the data "0" reading test operation by precharging the bit line RBLt to the high level H and precharging the bit line RBLb to a potential level that is lower than the high level H by the threshold voltage Vt.

The precharge circuit 24G can lower the precharge level of the bit line RBLb in a complementary relationship with the bit line RBLt relative to the precharge level of the bit line RBLt for the data "0" to be read in the reading bit line pair.

In the two-port memory cell applicable to the semiconductor storage device according to the embodiment, the product is determined to be a defective product (with an opening failure) during the data "0" reading test operation even when the sense amplifier circuit 28 is inclined, by lowering the precharge level of the bit line RBLb on the opposite side of the data to be read relative to the precharge level of the bit line RBLt1 of the data "0" to be read.

Next, precharge for the data "1" reading operation is performed. An output of the AND gate 62 of the precharge gate signal TPRE1n and the precharge enable signal PREn is input to the gate of the pMOSFET Q1n. Therefore, if the precharge gate signal TPRE1n for the pMOSFET Q1n is brought into the low level L, and the precharge gate signal TPRE1p for the nMOSFET Q1p is brought into the high level H as illustrated in FIG. 15C, the bit line RBLt is precharged to the high level H-Vt, and the bit line RBLb is precharged to the high level H. That is, it is possible to execute the data "1" reading test operation by precharging the bit line RBLt to the potential level that is lower than the high level H by the threshold voltage Vt and precharging the bit line RBLb to the high level H.

The precharge circuit 24G can lower the precharge level of the bit line RBLt in a complementary relationship with the bit line RBLb relative to the precharge level of the bit line RBLb for the data "1" to be read in the reading bit line pair.

In the two-port memory cell applicable to the semiconductor storage device according to the embodiment, the product is determined to be a defective product (with an opening failure) during the data "1" reading test operation even when the sense amplifier circuit 28 is inclined, by lowering the precharge level of the bit line RBLt on the opposite side of the data to be read relative to the precharge level of the bit line RBLb of the data "1" to be read.

Multiple-Port Memory Cell

Figure 16:
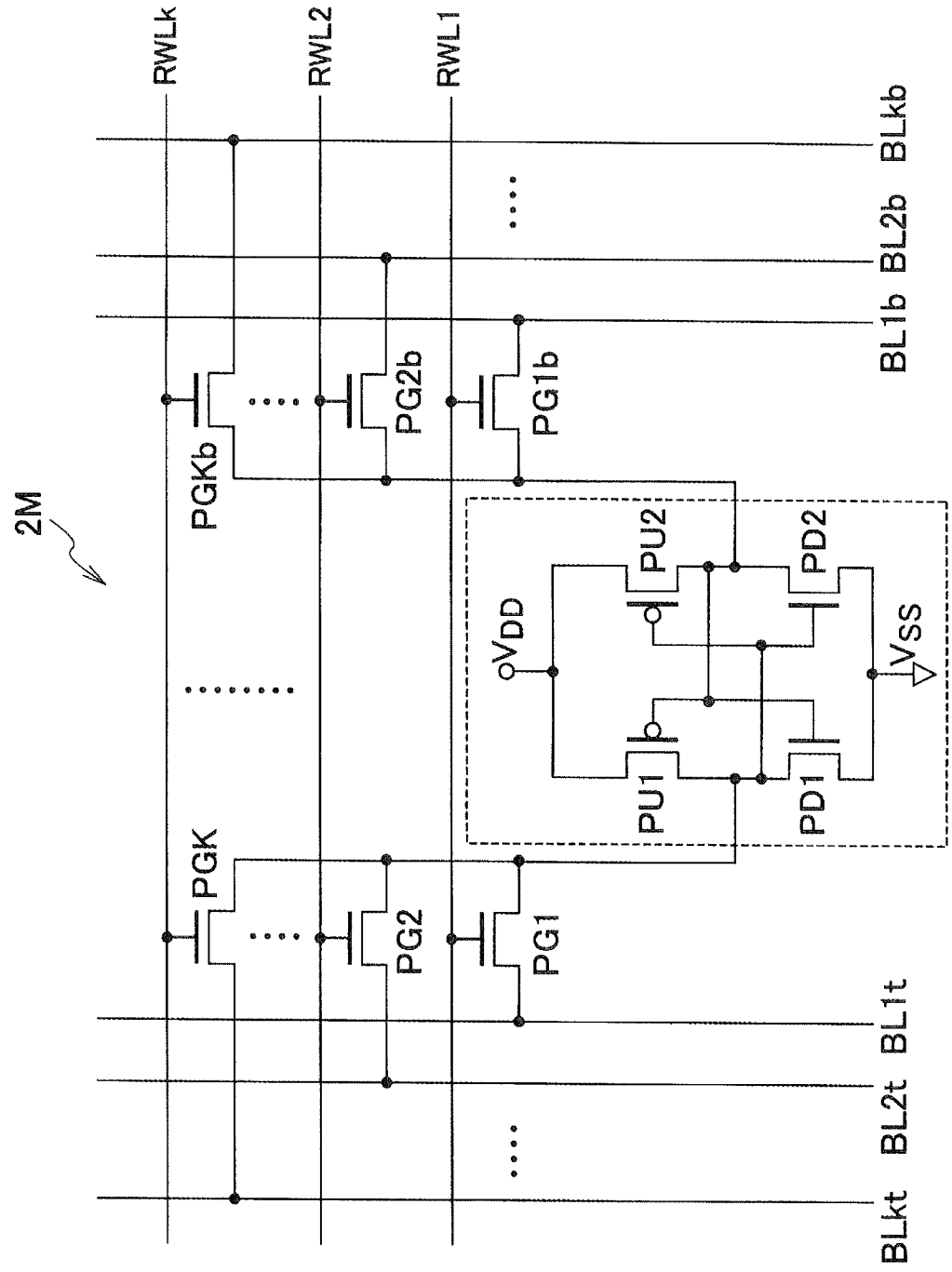
FIG. 16 is a schematic circuit configuration diagram of a multiple-port memory cell applicable to a semiconductor storage device according to an embodiment.

A schematic circuit configuration example of a multiple-port memory cell 2M that can be applied to the semiconductor storage device 10 according to the embodiment is illustrated in FIG. 16.

In the multiple-port memory cell 2M applicable to the semiconductor storage device 10 according to the embodiment, two inverters, each of which includes two MOSFETs (PU1 and PD1, and PU2 and PD2) between the power source voltage $V_{DD}$ and the ground potential $V_{SS}$, configure a storage element such that mutual outputs are connected to inputs of the counterparts as illustrated in FIG. 16. To each of two storage nodes of the storage element, k transfer gates PG1, PG2, . . . , PGK, PG1b, PG2b, . . . , PGKb are connected. The other main terminals of the transfer gates PG1, PG2, . . . , PGK are connected to bit lines BL1t, BL2t, . . . , BLkt. The other main terminals of the transfer gates PG1b, PG2b, . . . , PGKb are connected to bit lines BL1b, BL2b, . . . , BLkb. The bit lines BL1t, BL2t, . . . , BLkt and the bit lines BL1b, BL2b, . . . , BLkb are mutually in a complementary relationship.

Gates of the transfer gates PG1, PG2, . . . , PGK and the transfer gates PG1b, PG2b, . . . , PGKb are connected to writing word lines WWL1, WWL2, . . . , WWLk (not illustrated in FIG. 16) and the reading word lines RWL1, RWL2, . . . , RWLk.

Multiple-Port Memory Macro

Figure 17:
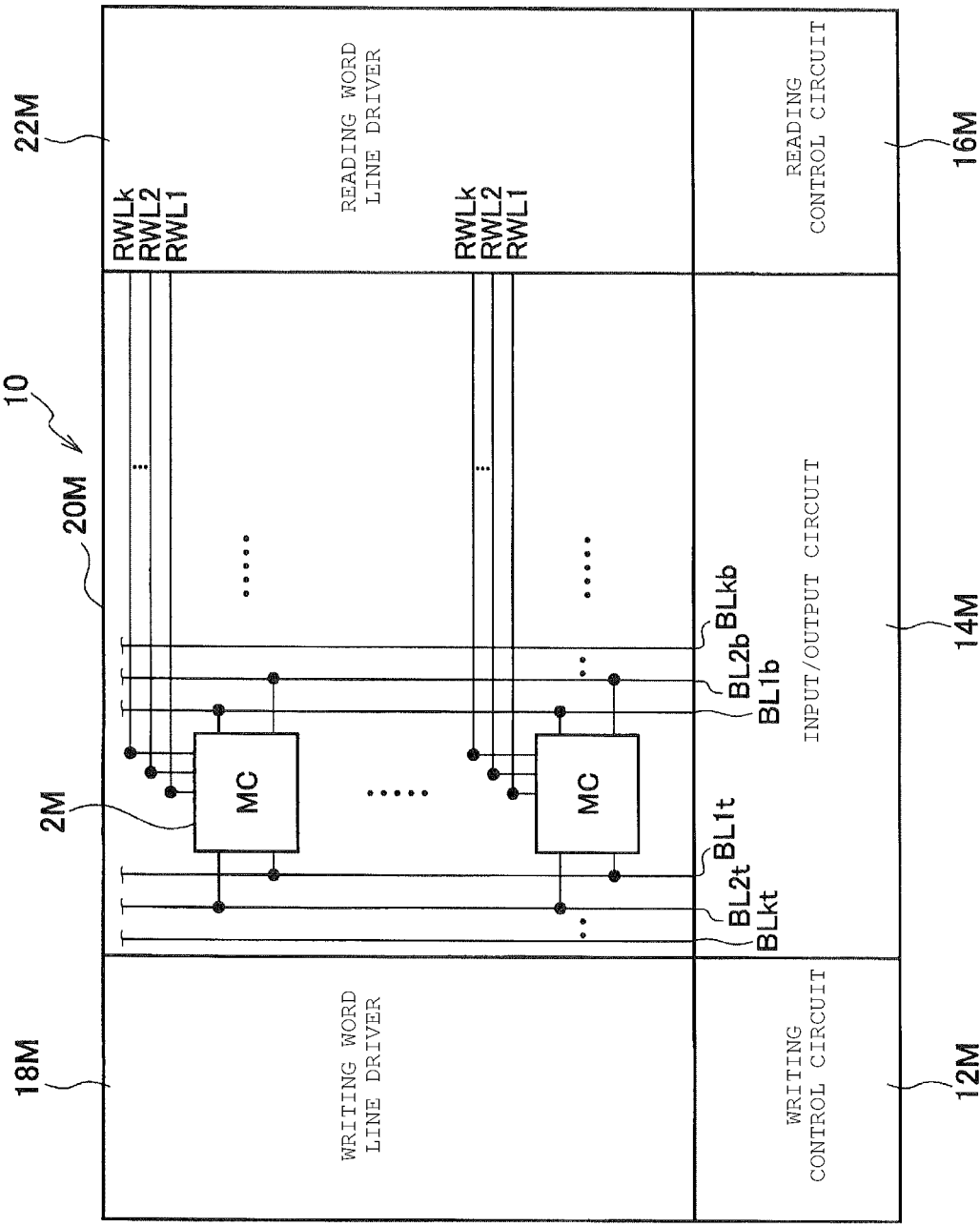
FIG. 17 is a block diagram illustrating a schematic configuration of a multiple-port memory macro that is a semiconductor storage device according to an embodiment.

In the semiconductor storage device 10 according to an embodiment, a schematic overall block configuration of a multiple-port memory macro includes a memory cell array 20M, writing word lines WWL1, WWL2, . . . , WWLk (not illustrated in FIG. 17), reading word lines RWL1, RWL2, . . . , RWLk, bit line pairs BL1t, BL1b, BL2t, BL2b, . . . , BLkt, and BLkb, a writing word line driver 18M, a reading word line driver 22M, an input/output circuit 14M, a writing control circuit 12M, and a reading control circuit 16M as illustrated in FIG. 17.

The memory cell array 20M includes a plurality of multiple-port memory cells 2M arranged in a matrix shape.

The writing word lines WWL1, WWL2, . . . , WWLk and the reading word lines RWL1, RWL2, . . . , RWLk are connected to the multiple-port memory cells 2M and select a multiple-port memory cell 2M.

The bit line pairs BL1t, BL1b, BL2t, BL2b, . . . , BLkt, BLkb are connected to the multiple-port memory cells 2M and write/read data in the multiple-port memory cells 2.

The writing word line driver 18M drives the multiple-port memory cells 2M via the writing word lines WWL1, WWL2, . . . , WWLk.

The reading word line driver 22M drives the multiple-port memory cells 2M via the reading word lines RWL1, RWL2, . . . , RWLk.

The input/output circuit 14M is connected to the bit line pairs BL1t, BL1b, BL2t, BL2b, . . . , BLkt, BLkb and writes and reads data in the memory cell array 20M.

The writing control circuit 12M is connected to the writing word line driver 18M and the input/output circuit 14M and controls writing of data in the memory cell array 20M.

The reading control circuit 16M is connected to the reading word line driver 22M and the input/output circuit 14M and controls reading of data from the memory cell array 20M.

In the semiconductor storage device 10 according to an embodiment, the configuration of the input/output circuit 14M may be configured similarly to the configuration in FIG. 6 illustrating the case of the two-port memory, even in the multiple-port memory macro. The precharge circuit can also be configured similarly to the circuit configuration illustrated in FIGS. 7, 12, and 14. The configuration of the reading control circuit 16M may also be configured similarly to the circuit configuration illustrated in FIG. 9.

Even in the multiple-port memory cell applicable to the semiconductor storage device according to the embodiment, the product is determined to be a defective product (with an opening failure) even when the sense amplifier circuit is inclined, and an error operation can be avoided, by lowering the precharge level of the bit line on the opposite side of the data to be read relative to the precharge level of the bit line of the data to be read. As for the timing of the sense amplifier enable signal SEN, ordinary data is appropriately read by performing reading at a timing of the delay time TD that is sufficiently later than the ordinary timing.

According to the embodiment, it is possible to detect a defective product that may be detected with difficulty in the related art. Therefore, it is possible to provide a multiple-port SRAM macro with high reliability and high quality.

Method of Operating Semiconductor Storage Device

Figure 18:
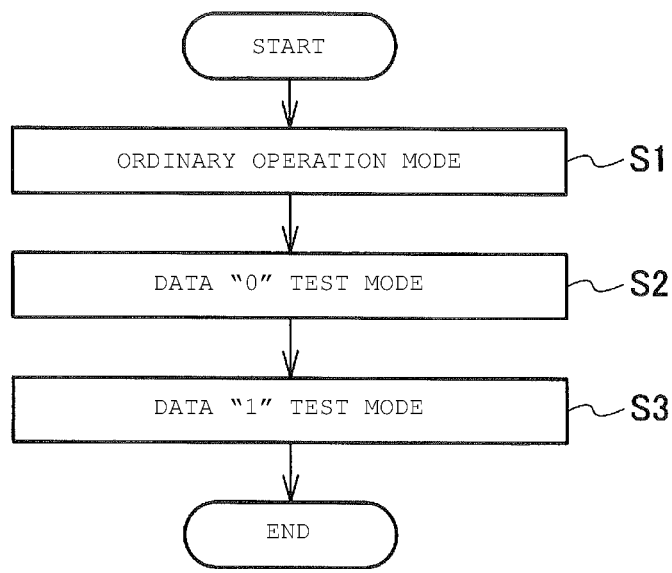
FIG. 18 is a flowchart of aspects in an operation mode of the semiconductor storage device according to the embodiment.
Figure 19:
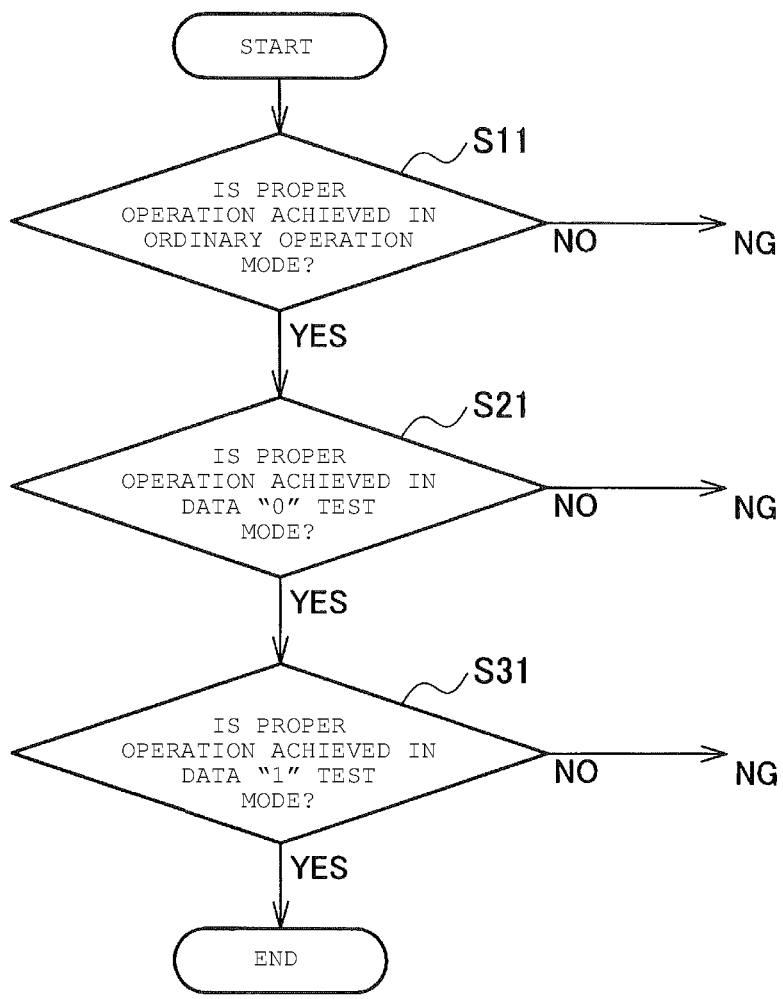
FIG. 19 is a flowchart of operation aspects of the semiconductor storage device according to the embodiment.

The flowchart for illustrating a flow of operation modes of the semiconductor storage device according to the embodiment is illustrated in FIG. 18. The flowchart for illustrating the method of operating the semiconductor storage device according to the embodiment is illustrated in FIG. 19.

The flow of the operation modes of the semiconductor storage device according to the embodiment has Step S1 in which an ordinary operation mode is executed, Step S2 in which a data "0" test mode is executed, and Step S3 in which a data "1" test mode is executed as illustrated in FIG. 18. Here, the ordinary operation mode, the data "0" test mode, and the data "1" test mode correspond to the ordinary operation (NORMAL) mode, the data "0" test mode, and the data "1" test mode in FIG. 11, respectively. In FIG. 18, Step S2 in which the data "0" test mode is executed and Step S3 in which the data "1" test mode is executed may be replaced with each other.

The method of operating the semiconductor storage device according to the embodiment includes: Step S11 in which whether or not an appropriate operation is performed in the ordinary operation mode is inspected, and if the result is NO, the product is determined to be a defective product, or if the result is YES, the process moves on to the data "1" test mode; Step S21 in which whether or not an appropriate operation is performed in the data "0" test mode is inspected, and if the result is NO, the product is determined to be a defective product, or if the result is YES, the process moves on to the data "1" test mode; and Step S31 in which whether or not an appropriate operation is performed in the data "1" test mode is inspected, and if the result is NO, the product is determined to be a defective product, or if the result is YES, the product is determined to be a non-defective product, as illustrated in FIG. 19. The data "0" test mode and the data "1" test mode may be replaced, and Step S21 may be executed after Step S31.

The method of operating the semiconductor storage device according to the embodiment has a step in which a precharge level of a second reading bit line in a complementary relationship with a first reading bit line is lowered relative to a precharge level of the first reading bit line for data to be read in the reading bit line pair during the test in the data "0" test mode and the data "1" test mode.

The method of operating the semiconductor storage device according to the embodiment further has a step in which driving of the sense amplifier circuit is delayed until the potential difference of the reading bit line pair reaches a threshold voltage.

According to the semiconductor storage device and the operation method thereof in the embodiments, it is possible to fail an operation and to detect the failure in a case in which an opening failure occurs, by setting the precharge level of the bit line on the opposite side of the data to be read to a low potential and performing the reading operation over a time that is longer than an ordinary time as described above. Therefore, it is possible to provide a semiconductor storage device and an operation method thereof with high reliability and high quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
    a memory cell;
    a write word line and a read word line connected to the memory cell;
    first and second write bit lines connected to the memory cell;
    first and second read bit lines connected to the memory cell;
    a precharge circuit configured to charge the first read bit line to a first potential and the second read bit line to a second potential lower than the first potential; and
    a sense amplifier circuit configured to amplify a difference of potentials between the first read bit line and the second read bit line during a reading of the memory cell and output a signal corresponding to the difference of potentials as a read value,
    wherein the precharge circuit is configured to:
    charge the first read bit line to the first potential and the second read bit line to the second potential before the reading of the memory cell in a first read mode, and
    charge the second read bit line to a third potential and the first read bit line to a fourth potential lower than the third potential before the reading of the memory cell in a second read mode.

2. The semiconductor storage device according to claim 1, further comprising:
    a delay circuit configured to delay a sense amplifier enable signal that enables the sense amplifier circuit.

3. The semiconductor storage device according to claim 1, wherein the third potential is equal to the first potential, and the fourth potential is equal to the second potential.

4. The semiconductor storage device according to claim 1, wherein the precharge circuit is further configured to charge the first read bit line and the second read bit line to a same potential before the reading of the memory cell in a third read mode.

5. The semiconductor storage device according to claim 4, further comprising:
    a delay circuit configured to delay a sense amplifier enable signal that enables the sense amplifier circuit, wherein
    the delayed sense amplifier enable signal is supplied to the sense amplifier circuit in the first and second read modes, and
    the sense amplifier enable signal is supplied to the sense amplifier circuit without being delayed by the delay circuit in the third read mode.

6. The semiconductor storage device according to claim 1, wherein the first read mode is a test read mode to read a first single-digit binary value and the second read mode is a test read mode to read a second single-digit binary value.

7. The semiconductor storage device according to claim 1, wherein the memory cell is one of an array of memory cells, and the precharge circuit is provided for a column of the array of memory cells.

8. A semiconductor storage device, comprising:
    a memory cell;
    a write word line and a read word line connected to the memory cell;
    first and second write bit lines connected to the memory cell;

first and second read bit lines connected to the memory cell;
a precharge circuit configured to charge the first read bit line to a first potential and the second read bit line to a second potential lower than the first potential; and
a sense amplifier circuit configured to amplify a difference of potentials between the first read bit line and the second read bit line during a reading of the memory cell and output a signal corresponding to the difference of potentials as a read value, wherein the precharge circuit includes:
a first precharge circuit configured to charge the first read bit line and the second read bit line to an equal potential;
a second precharge circuit configured to charge the first read bit line, but not the second read bit line; and
a third precharge circuit configured to charge the second read bit line, but not the first read bit line.

9. The semiconductor storage device according to claim 8, wherein
the first precharge circuit includes:
a first MOSFET of p-type connected between a first node at a power source voltage and the first read bit line;
a second MOSFET of p-type connected between a second node at the power source voltage and the second read bit line; and
a third MOSFET of p-type connected between the first read bit line and the second read bit line, wherein gates of the first, second, and third MOSFETs are connected to each other,
the second precharge circuit includes:
a fourth MOSFET of n-type connected between a third node at the power source voltage and the first read bit line; and
a fifth MOSFET of p-type connected between a fourth node at the power source voltage and the first read bit line, and
the third precharge circuit includes:
a sixth MOSFET of n-type connected between a fifth node at the power source voltage and the second read bit line; and
a seventh MOSFET of p-type connected between a sixth node at the power source voltage and the second read bit line.

10. The semiconductor storage device according to claim 8, wherein
the first precharge circuit includes:
a first MOSFET of p-type connected between a first node at a power source voltage and the first read bit line;
a second MOSFET of p-type connected between a second node at the power source voltage and the second read bit line; and
a third MOSFET of p-type connected between the first read bit line and the second read bit line, wherein gates of the first, second, and third MOSFETs are connected to each other,
the second precharge circuit includes:
a fourth MOSFET of p-type connected between a third node at a voltage lower than the power source voltage and the first read bit line; and
a fifth MOSFET of p-type connected between a fourth node at the power source voltage and the first read bit line, and
the third precharge circuit includes:
a sixth MOSFET of p-type connected between a fifth node at a voltage lower than the power source voltage and the second read bit line; and
a seventh MOSFET of p-type connected between a sixth node at the power source voltage and the second read bit line.

11. The semiconductor storage device according to claim 8, wherein
the first precharge circuit includes a first MOSFET of p-type connected between the first read bit line and the second read bit line,
the second precharge circuit includes:
a second MOSFET of n-type connected between a first node at the power source voltage and the first read bit line; and
a third MOSFET of p-type connected between a second node at the power source voltage and the first read bit line, a gate of the third MOSFET connected to a first AND gate having a first input terminal that receives a first precharge gate signal and a second input terminal that receives a precharge enable signal, and
the third precharge circuit includes:
a fourth MOSFET of n-type connected between a third node at the power source voltage and the second read bit line; and
a fifth MOSFET of p-type connected between a fourth node at the power source voltage and the second read bit line, a gate of the fifth MOSFET connected to a second AND gate having a third input terminal that receives a second precharge gate signal and a fourth input terminal that receives the precharge enable signal.

12. The semiconductor storage device according to claim 8, wherein the memory cell is one of an array of memory cells, and the precharge circuit is provided for a column of the array of memory cells.

13. A method of operating a semiconductor storage device that includes a memory cell, a write word line and a read word line connected to the memory cell, first and second write bit lines connected to the memory cell, and first and second read bit lines connected to the memory cell, the method comprising:
before reading from the memory cell in a first read mode, charging the first read bit line to a first potential and the second read bit line to a second potential;
during the reading from the memory cell in the first read mode, amplifying a difference in potential between the first read bit line and the second read bit line and outputting a signal corresponding to the difference in potential as a read value;
before reading from the memory cell in a second read mode, charging the second read bit line to a third potential and the first read bit line to a fourth potential lower than the third potential; and
during the reading from the memory cell in the second read mode, amplifying a difference in potential between the first read bit line and the second read bit line and outputting a signal corresponding to the difference in potential as a read value.

14. The method according to claim 13, wherein the third potential is equal to the first potential, and the fourth potential is equal to the second potential.

15. The method according to claim 13, wherein the first read mode is a test read mode to read a first single-digit binary value and the second read mode is a test read mode to read a second single-digit binary value.

16. The method according to claim 13, further comprising:
- before reading from the memory cell in a third read mode, charging the first read bit line and the second read bit line to an equal potential; and
- during the reading from the memory cell in the third read mode, amplifying a difference in potential between the first read bit line and the second read bit line and outputting a signal corresponding to the difference in potential as a read value.

17. The method according to claim 16, wherein a first timing to amplify the difference in potential during the first read mode and a second timing to amplify the difference in potential during the second read mode are delayed with respect to a third timing to amplify the difference in potential during the third read mode.

18. The method according to claim 16, further comprising:
- determining whether the reading in the third read mode failed based on the read value output during the third read mode, wherein
- the reading in the first mode and the reading in the second mode are carried out upon determining that the reading in the third read mode failed.

19. The method according to claim 18, further comprising:
- determining whether the reading in the first read mode failed based on the read value output during the first read mode, wherein
- the reading in the second mode is carried out upon determining that the reading in the first read mode failed.

* * * * *